United States Patent
Higuchi et al.

(10) Patent No.: US 7,425,223 B2
(45) Date of Patent: Sep. 16, 2008

(54) METHOD FOR PREPARING ELECTROCHEMICAL DEVICE WITH A LAYER STRUCTURE

(75) Inventors: Hiroshi Higuchi, Kyotanabe (JP); Shuji Ito, Nara (JP); Kazuya Iwamoto, Sakai (JP); Masaya Ugaji, Neyagawa (JP); Hiromu Matsuda, Kawabe-gun (JP); Shinji Mino, Ibaraki (JP); Yasuyuki Shibano, Sakai (JP); Junichi Inaba, Toyonaka (JP); Kazuyoshi Honda, Takatsuki (JP); Sadayuki Okazaki, Katano (JP); Hitoshi Sakai, Nagoya (JP); Yoriko Takai, Toyonaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 614 days.

(21) Appl. No.: 10/432,500

(22) PCT Filed: Sep. 2, 2002

(86) PCT No.: PCT/JP02/08897

§ 371 (c)(1),
(2), (4) Date: Sep. 18, 2003

(87) PCT Pub. No.: WO03/021706

PCT Pub. Date: Mar. 13, 2003

(65) Prior Publication Data
US 2004/0058237 A1   Mar. 25, 2004

(30) Foreign Application Priority Data
Sep. 3, 2001   (JP) .............................. 2001-265510

(51) Int. Cl.
*H01M 6/00*   (2006.01)
*C23C 8/00*   (2006.01)

(52) U.S. Cl. ..................... 29/623.1; 29/623.3; 29/623.5; 427/585

(58) Field of Classification Search ................. 29/623.5, 29/623.3, 623.1; 427/457, 475, 471, 585
See application file for complete search history.

(56) References Cited

U.S. PATENT DOCUMENTS 4,474,686 A   10/1984   Miyauchi et al.
(Continued)

FOREIGN PATENT DOCUMENTS

JP   08-045338 A   2/1996
(Continued)

OTHER PUBLICATIONS

Kang, Youn-Seon, et al., "Plasma Treatments for the Low Temperature Crystallization of $LiCoO_2$ Thin Films", *Journal of the Electrochemical Society*, 148(11), pp. A1254-A1259 (2001).
(Continued)

*Primary Examiner*—Raymond Alejandro
(74) *Attorney, Agent, or Firm*—Panitch Scchwarze Belisario & Nadel LLP

(57) ABSTRACT

To provide an electrochemical device with a layer structure causing no deterioration of characteristics of materials, in the method for preparing an electrochemical device comprising a first current collector, a first electrode active material layer, a solid electrolyte layer, a second electrode active material layer and a second current collector, all of which are accumulated, the first electrode active material layer, the second electrode active material layer or the solid electrolyte layer is formed by supplying atoms, ions or clusters constituting the first electrode active material layer, the second electrode active material layer or the solid electrolyte layer to the substrate, while irradiating electrons or electromagnetic waves with energy prescribed according to the composition of the first electrode active material layer, the second electrode active material layer or the solid electrolyte layer.

5 Claims, 9 Drawing Sheets

U.S. PATENT DOCUMENTS

| | | | |
|---|---|---|---|
| 5,314,765 | A | 5/1994 | Bates |
| 5,338,625 | A | 8/1994 | Bates et al. |
| 5,567,210 | A | 10/1996 | Bates et al. |
| 6,066,417 | A | 5/2000 | Cho et al. |
| 6,094,292 | A | 7/2000 | Goldner et al. |
| 2002/0000034 | A1* | 1/2002 | Jenson ..................... 29/623.5 |

FOREIGN PATENT DOCUMENTS

| | | |
|---|---|---|
| JP | 08-236105 A | 9/1996 |
| JP | 08-287901 * | 11/1996 |
| JP | 08-287901 A | 11/1996 |
| JP | 10-284130 A | 10/1998 |

OTHER PUBLICATIONS

Koksbang, R., et al., "Cathode Materials for Lithium Rocking Chair Batteries", *Solid State Ionics*, 84, pp. 1-21 (1996).

Ohzuku, Tsutomu, et al., "Zero-Strain Insertion Material of $Li[Li_{1/3}Ti_{5/3}]O_4$ for Rechargeable Lithium Cells", *J. Electrochem. Soc.*, 142(5), pp. 1431-1435 (1995).

\* cited by examiner (a)

(b)

(a)

(b)

METHOD FOR PREPARING ELECTROCHEMICAL DEVICE WITH A LAYER STRUCTURE

CROSS-REFERENCE TO RELATED APPLICATION

This application is a Section 371 of International Application No. PCT/JP02/08897, filed Sep. 2, 2002, the disclosure of which is incorporated herein by reference.

TECHNICAL FIELD

The present invention relates to a method for preparing a high-capacity thin-type electrochemical device.

BACKGROUND ART

All-solid-state batteries (thickness, 25 μm) have been introduced, which can be made thinner than lithium polymer batteries by introduction of a thin film process developed with respect to semiconductors (U.S. Pat. No. 5,338,625). In particular, all-solid-state batteries having constituents made thinner by a thin film process are expected to have several times higher energy density than that of the conventional batteries by continuous lamination of the respective constituents, and have attracted much attention.

In the all-solid-state batteries made thinner, however, it is required that an electrode active material is capable of intercalating lithium in the high density and at a high speed in charging/discharging and a solid electrolyte shows high ionic conductivity against lithium ions.

Materials used for the electrode active material may be exemplified by crystalline materials such as $LiCoO_2$, $LiMn_2O_4$, $LiNiO_2$, $V_2O_5$, $MoO_2$ and $TiS_2$.

On the other hand, solid electrolytes are classified into crystalline solid electrolytes and amorphous solid electrolytes. $Li_3PO_4$—$Li_4SiO_4$ as one of the crystalline solid electrolytes has the ionic conductivity of $10^{-6}$ to $10^{-5}$ $Scm^{-1}$ and has excellent heat resistance, but has a problem that the ionic conductivity thereof has anisotropy and it is therefore difficult to use in batteries. In contrast, amorphous solid electrolytes basically have poor heat resistance, but the ionic conductivity thereof has no anisotropy. In addition, the following sulfur-type solid electrolytes particularly exhibit higher ionic conductivity as compared with oxygen-type solid electrolytes. The amorphous oxygen-type solid electrolytes may include, for example, $Li_{2.9}PO_{3.3}N_{0.36}$ and amorphous $Li_3PO_4$—$Li_4SiO_4$, and these have the ionic conductivity of $10^{-5}$ to $10^{-4}$ $Scm^{-1}$. As opposed to this, the amorphous sulfur-type solid electrolytes may include, for example, $Li_2S$—$SiS_2$, $Li_2S$—$P_2S_5$ and $Li_2S$—$B_2S_3$, as well as solid electrolytes obtained by addition of lithium halide such as LiI or lithium oxygen acid salts such as $Li_3PO_4$ to these materials, and these electrolytes have the further high ionic conductivity of $10^{-4}$ to $10^{-3}$ $Scm^{-1}$.

In preparing a crystal film of an electrode active material, it is an ordinary way to heat the whole of a substrate in order to rearrange constituent atoms to form a crystal lattice. As described above, however, since solid electrolytes with high ionic conductivity have a low heat resistance temperature, the solid electrolyte layer is heated at the same time in the heating process for crystallization of the electrode active material layer so that the temperature of the solid electrolyte layer exceeds the inherent temperature to cause crystallization, resulting in a decrease in ionic conductivity thereof. When an electrode active material layer is formed on the substrate with the solid electrolyte layer previously formed thereon, therefore, it is necessary to supply rearrangement energy for constituent atoms of the electrode active material layer from any part other than the substrate, in order to form the electrode active material layer so that the temperature of the substrate is not raised and the temperature of the solid electrolyte layer formed on the substrate is not raised.

As a special method for energy supply different from the heating of the substrate, Japanese Patent Laid-Open Publication No. Hei 8-287901 discloses the following method. That is, when a lithium-containing crystalline electrode active material layer is prepared by vapor-deposition, there have been proposed, for the purpose of improving the crystallinity of the electrode active material layer and improving adhesion to a substrate, irradiation of the substrate with an ion beam having the energy of 100 eV or higher as the rearrangement energy for atoms, irradiation of the substrate with oxygen together with the ion beam, and irradiation of the substrate with electromagnetic waves such as high-frequency plasmas or ultraviolet ray.

FIG. 3 shows a basic constitutional unit of an all-solid-state battery. The all-solid-state battery with a structure shown in FIG. 3 is formed by the successive lamination, while dry patterning by means of a metal mask or the like, of a first electrode active material layer 52, a solid electrolyte layer 53, a second electrode active material layer 54 and a second current collector 55 on a first current collector 51 also serving as a substrate. What becomes a problem here is a process of forming the first electrode active material layer 52, the solid electrolyte layer 53 and the second electrode active material layer 54. It is to be noted that the present invention is effective for the process of forming these layers.

FIGS. 4 and 5 show the structures further developed from the structure shown in FIG. 3. FIG. 4 shows an all-solid-state battery with a two-stack parallel structure, and FIG. 5 shows an all-solid-state battery with a two-stack serial structure. It should be noted that the present invention is also effective for all-solid-state electrolyte batteries with the further large stack number as well as all-solid-state batteries with a combination of parallel and serial structures.

At present, $LiCoO_2$, $LiNiO_2$, $LiMn_2O_4$, $LiV_2O_5$ and the like, which are the main electrode active materials used as the materials of lithium ion batteries, require relatively high temperature for crystal formation, whereas the most crystallization of solid electrolytes usually occur around 300 to 350° C. On the contrary, when a combination of an electrode active material having an extremely low melting point, such as Li, and a crystalline solid electrolyte is used, the electrode active material may melt in formation of the solid electrolyte layer. In the battery process for fabricating batteries with the structures shown in FIGS. 3 to 5, it has been necessary to solve the discrepancy caused by the tolerance temperatures of the individual materials.

To solve such a problem, there has conventionally been used an ion irradiation apparatus. The examples of the ion irradiation apparatus may include an ion sputtering apparatus with an accelerating voltage of a hundred kilovolt to several tens of kilovolts, and an ion plantation apparatus with a voltage higher than that; however, when these apparatuses are used and ions with a high energy of 100 eV or higher are irradiated according to the prior art as described, for example, in Japanese Patent Laid-Open Publication Hei 8-287901, the following problems may occur.

The first problem is a decrease in ionic conductivity by the temperature rise of a solid electrolyte layer. The temperature of the surface area of a portion serving as a base material to form a film or a layer drastically rises by an ion collision.

When the surface for forming a film thereon (base material surface) is a solid electrode layer, for example, there arises a problem that the ionic conductivity of the surface area of the solid electrolyte layer is impaired and the performance of a battery finally obtained is deteriorated. This is because the ions have a mass close to that of atoms so that the temperature of atoms having collided with the ions and the temperature around these atoms arise to cause partial crystallization of the solid electrolyte layer. A decrease in ionic conductivity is a very important indicator because it restricts the current of the battery, and a decrease in ionic conductivity in the process as described above thus cannot be ignored.

The second problem is that the grade of crystallinity obtained by ion irradiation has a limit. The cause of the limit on the grade of crystallinity is mainly in that the collision of an electrode active material with ions adds energy needed for crystallization and at the same time the collision of the already crystallized electrode active material layer with ions causes disturbance of crystal lattices. In particular, the crystal lattices of the electrode active material layer are portions into which Li ions are inserted and also are passages though which Li ions diffuse, and hence the disturbance of these crystal lattices causes a decrease in capacity of the battery and a decrease in current for charge and discharge.

Further, when an oxide film or a nitride film is formed by an ordinary vacuum film formation process, the ratio of a gas with high vapor pressure, such as oxygen or nitrogen, has a tendency to decrease from the atmosphere. This is mainly because these gases are scattered by a difference in vapor pressure and released outside by a vacuum pump. This phenomenon also causes the disturbance of crystal lattices of the electrode active material layer, resulting in decreases in capacity of the battery, current for charge and discharge, and the like. To solve such a problem, ions such as oxygen ions or nitrogen ions have conventionally been irradiated. This method is already known to be effective as a measure against atom defects; however, from the reasons that the ions used therein are limited to those with low energy and the ion current has an upper limit, there arises a problem that the speed of film formation is remarkably low, i.e., several angstroms per minute or lower.

It is thus an object of the present invention to provide an electrochemical device, having a layer structure causing no deterioration in the characteristics of various materials as described above, as well as a method for preparing the same, which solve the problems on the battery fabrication process as described above.

DISCLOSURE OF INVENTION

The present invention relates to a method for preparing an electrochemical device comprising a first current collector, a first electrode active material layer, a solid electrolyte layer, a second electrode active material layer and a second current collector, all of which are laminated, characterized in that the method comprises a film formation step of forming the first electrode active material layer, the second electrode active material layer or the solid electrolyte layer by supplying atoms, ions or clusters constituting the first electrode active material layer, the second electrode active material layer or the solid electrolyte layer to the substrate, while irradiating electrons or electromagnetic waves with energy prescribed according to the composition of the first electrode active material layer, the second electrode active material layer or the solid electrolyte layer.

It is preferable that the electrons or electromagnetic waves are irradiated to the surface of the substrate.

It is also preferable that the electrons or electromagnetic waves are irradiated to the atoms, ions or clusters. It is particularly preferable that in an atmosphere, the electrons or electromagnetic waves are irradiated to the atoms, ions or clusters to be supplied toward the substrate.

It is further preferable that the temperature for crystallization of a layer to be formed in the film formation step is higher than the temperature for crystallization, or the melting point, of layers other than the layer to be formed. It is further preferable that the temperature of layers other than the layer to be formed in the film formation step is maintained in a range prescribed according to the composition thereof.

It is further preferable that the strength of the energy and heat exhausted from the substrate are adjusted so that the temperature of the substrate does not exceed the temperature for crystallization, or the melting point, of layers other than the layer to be formed in the film formation step.

It is further preferable that when a compound constituting the layer to be formed in the film formation step is an oxide or a nitride, a gas atmosphere containing oxygen or oxygen ions, or an inert gas atmosphere containing nitrogen or nitrogen ions, is used as an atmosphere for vapor-deposition.

Moreover, the present invention relates to an electrochemical device obtained by the above method for preparing an electrochemical device. That is, the present invention relates to an electrochemical device comprising a first current collector, a first electrode active material layer, a solid electrolyte layer, a second electrode active material layer, and a second current collector, characterized in that the first electrode active material layer and the second electrode active material layer exhibit sharp peaks in the X-ray diffraction pattern and the solid electrolyte layer exhibits broad peaks in the X-ray diffraction pattern.

In the electrochemical device obtained by the above preparation method, the first electrode active material layer and the second electrode active material layer are crystalline and the solid electrolyte layer is amorphous.

BEST MODE FOR CARRYING OUT THE INVENTION

Figure 1:
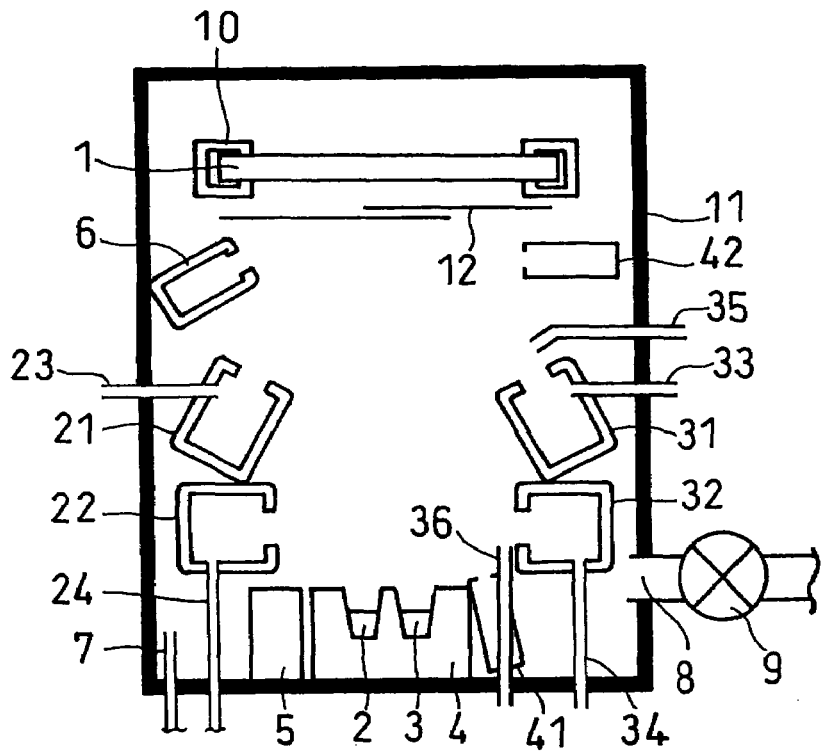
FIG. 1 is a schematic view of a film formation apparatus used in the example of the present invention.

The present invention relates to a method for preparing an electrochemical device comprising a first current collector, a first electrode active material layer, a solid electrolyte layer, a second electrode active material layer and a second current collector, all of which are laminated, characterized in that the method comprises a film formation step of forming the first electrode active material layer, the second electrode active material layer or the solid electrolyte layer by vapor-depositing atoms, ions or clusters constituting the first electrode active material layer, the second electrode active material layer or the solid electrolyte layer on the substrate, while irradiating energy prescribed according to the composition of the first electrode active material layer, the second electrode active material layer or the solid electrolyte layer.

The preparation method is especially effective when the temperature for crystallization of a layer to be formed in the film formation step is higher than the temperature for crystallization, or the melting point, of layers other than the layer to be formed.

It is also preferable that the carrier of the energy is an electron or an electromagnetic wave.

It is further preferable that the temperature of layers other than the layer to be formed in the film formation step is maintained in a range prescribed according to the composition thereof.

It is further preferable that the strength of the energy and heat exhausted from the substrate are adjusted so that the temperature of the substrate does not exceed the temperature for crystallization, or the melting point, of layers other than the layer to be formed in the film formation step.

It is preferable that when a compound constituting the layer to be formed in the film formation step is an oxide or a nitride, a gas atmosphere containing oxygen or oxygen ions, or an inert gas atmosphere containing nitrogen or nitrogen ions, is used as an atmosphere for vapor-deposition.

The preparation method in accordance with the present invention as thus described can be mainly classified into: the case of forming an amorphous solid electrolyte layer which can be crystallized at low temperatures and a first electrode active material layer and/or a second electrode active material layer which can be crystallized at high temperatures; the case of forming a second electrode active material layer which can be crystallized at low temperatures and a first electrode active material layer which can be crystallized at high temperatures; and the case of forming a second electrode active material layer which can be crystallized at low temperatures and a crystalline solid electrolyte layer which can be crystallized at high temperatures. Favorable conditions may also differ according to these cases. In the following, the manners of the method for preparing an electrochemical device in accordance with the present invention are described.

(i) First Preparation Method

A first preparation method in accordance with the present invention is a method for preparing an electrochemical device comprising a first current collector, a first electrode active material layer, a solid electrolyte layer, a second electrode active material layer and a second current collector, all of which are laminated, characterized in that:

the first electrode active material layer or the second electrode active material layer is formed on the substrate by a film formation step of vapor-depositing atoms, ions or clusters constituting the first electrode active material layer or the second electrode active material layer on the surface of the solid electrolyte layer; and the atoms, ions or clusters constituting the first electrode active material layer or the second electrode active material layer are irradiated with energy having a strength prescribed according to the composition of the first electrode active material layer or the second electrode active material layer in the film formation step, while the temperature of the solid electrolyte layer is maintained in a range prescribed according to the composition of the solid electrolyte layer.

It is preferable that the carrier of the energy to be irradiated to the atoms, ions or clusters constituting the electrode active material layer is an electron or an electromagnetic wave.

It is preferable that the temperature for crystallization of at least one of the first electrode active material layer and the second electrode active material layer is higher than the temperature for crystallization of the solid electrolyte layer.

It is also preferable that when the first electrode active material layer or the second electrode active material layer is formed, the strength of the energy to be irradiated (strength E (eV)) satisfies the relational expression (1):

$$E_a \leq E \leq (70 \pm \alpha) \times (\rho_1 d_1)^{1/2}$$

where $-7 \leq \alpha \leq 7$, $E_a$ is activation energy (eV) of the electrode active material layer, $\rho_1$ is density (g/cm$^3$) of the electrode active material layer, and $d_1$ is lattice constant (Å) of the electrode active material layer.

The energy to be irradiated or collided in a constant amount here is in effect set in a range extended to some degree because onetime irradiation or collision will not arrest the movement of the ions or the like completely. Such dispersion of the energy is often expressed by a probability density function of the Gauss-distribution and the extended range thereof can be represented by two values, which have a central value of $e^{-2} \approx 0.1$, i.e. the central value satisfying $e^{-2} \approx 0.1$. In the present invention, therefore, the central value was set to 70 and the extended range was set to 7 ($-7 \leq \alpha \leq 7$).

The activation energy of the electrode active material layer here means a minimum energy required for elements constituting the electrode active material layer to form the composition of the electrode active material layer. It is considered in the strict sense that crystallization can proceed when a temperature is not lower than a temperature for crystallization. From the perspective of generation rate, however, provision of energy in a degree required for an electrode active material temporarily generated as an incomplete material to return to the state of constituent gases renders crystallization smoothly proceed.

Figure 14:
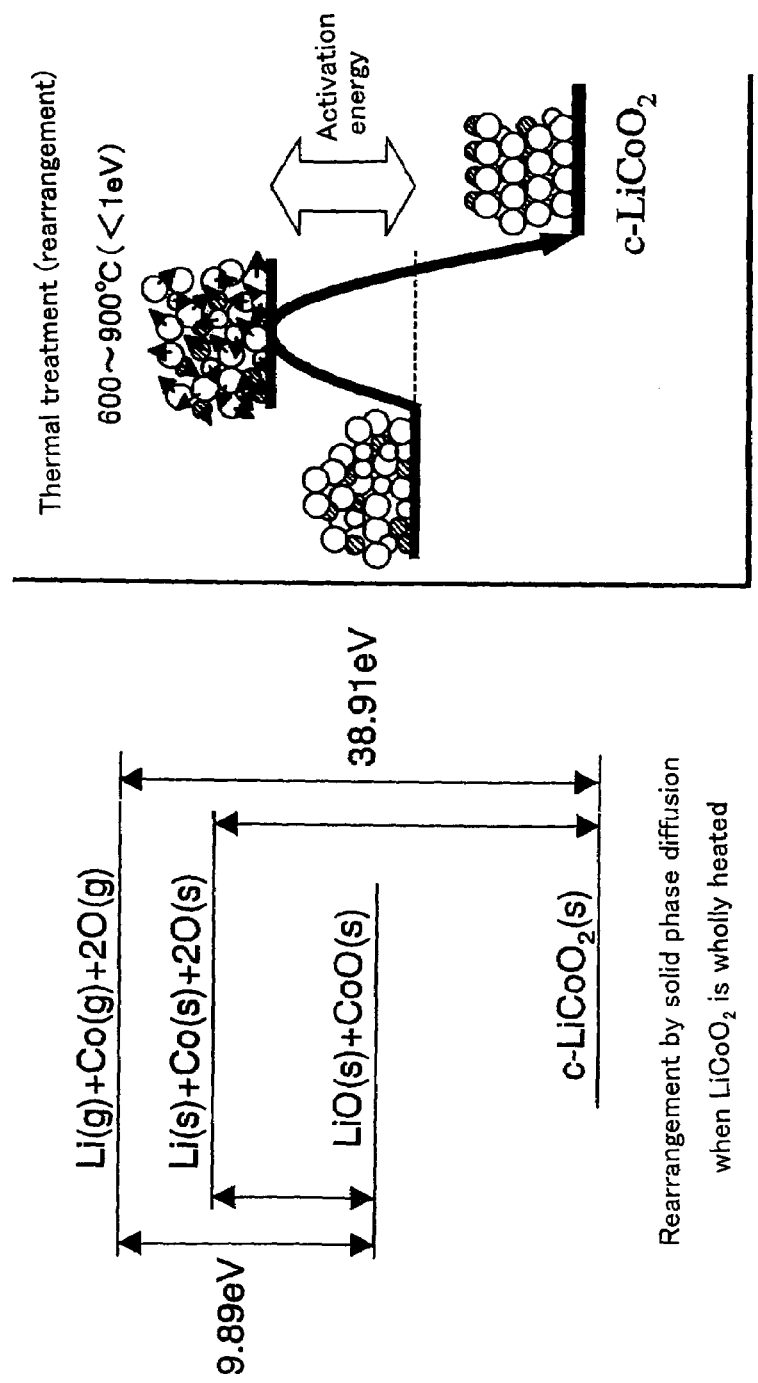
FIG. 14 is a diagram showing a crystallization model of $LiCoO_2$.

Herein, in the case of lithium cobaltate ($LiCoO_2$), for example, energy is calculated as follows since the starting temperature for crystallization is about 400° C. at lowest. FIG. 14 shows a crystallization model of $LiCoO_2$. FIG. 14 demonstrates rearrangement by solid phase diffusion when $LiCoO_2$ is wholly heated.

Energy E (eV) needed for heating lithium cobaltate having a molar specific heat C (=58.5 J/mol/K) from normal temperature to 400° C. is expressed by:

$$E = \Delta TC/eN_A = 0.41 (eV)$$

where $N_A$ is Avogadro's number and e is elementary charge.

However, such energy is not practical since, with this energy, crystals are generated at a slow rate. It is therefore preferable that not less than 9 eV of energy is irradiated which is required by the following redecomposition of the incompletely generated material as, for example, Li$_2$O(s) and CoO(s):

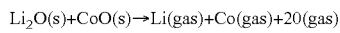

It is further preferable that power of the energy to be irradiated and power of heat exhausted from the substrate are adjusted so that the temperature of the substrate does not exceed the temperature for crystallization of the solid electrolyte layer when the first electrode active material layer or the second electrode active material layer is formed.

It is preferable that when an electrode active material constituting the first electrode active material layer or the second electrode active material layer is an oxide or a nitride, a gas atmosphere containing oxygen or oxygen ions, or an inert gas atmosphere containing nitrogen or nitrogen ions, is used as an atmosphere for vapor-deposition.

(ii) Second Preparation Method

A second preparation method in accordance with the present invention is a method for preparing an electrochemical device comprising a first current collector, a first electrode active material layer, a solid electrolyte layer, a second electrode active material layer and a second current collector, all of which are laminated, characterized in that:

the first electrode active material layer is formed on the substrate by a film formation step of vapor-depositing atoms, ions or clusters constituting the first electrode active material layer on the surface of the first current collector; and the atoms, ions or clusters constituting the first electrode active material layer are irradiated with energy having the strength prescribed according to the composition of the first electrode active material layer in the film formation step, while the temperature of the substrate is maintained in a range prescribed according to the composition of the second electrode active material layer.

It is preferable that the carrier of the energy to be irradiated to the atoms, ions or clusters constituting the first electrode active material layer is an electron or an electromagnetic wave.

It is preferable that the temperature for crystallization of the first electrode active material layer is higher than the melting point of the second electrode active material layer.

It is also preferable that when the first electrode active material layer is formed, the strength of the energy to be irradiated (strength E (eV)) satisfies the relational expression (2):

$$E_a \leq E \leq (70\pm\alpha)\times(\rho_2 T_2)^{1/2}$$

where $-7 \leq \alpha \leq 7$, $E_a$ is activation energy (eV) of the first electrode active material layer, $\rho_2$ is density (g/cm$^3$) of a layer (the solid electrolyte layer or the current collector layer) on the second electrode active material layer, $T_2$ is thickness (Å) of a layer (the solid electrolyte layer or the current collector layer) on the second electrode active material layer.

It is further preferable that power of the energy to be irradiated and power of heat exhausted from the substrate are adjusted so that the temperature of the substrate does not exceed the melting point of the second electrode active material layer when the first electrode active material layer is formed.

It is preferable that when an electrode active material constituting the first electrode active material layer is an oxide or a nitride, a gas atmosphere containing oxygen or oxygen ions, or an inert gas atmosphere containing nitrogen or nitrogen ions, is used as an atmosphere for vapor-deposition.

(iii) Third Preparation Method

A third preparation method in accordance with the present invention is a method for preparing an electrochemical device comprising a first current collector, a first electrode active material layer, a solid electrolyte layer, a second electrode active material layer and a second current collector, all of which are laminated, characterized in that:

the solid electrolyte layer is formed on the substrate by a film formation step of vapor-depositing atoms, ions, or clusters constituting the solid electrolyte layer on the surface of the first electrode active material layer; and the atoms, ions or clusters constituting the solid electrolyte layer are irradiated with energy having the strength prescribed according to the composition of the solid electrolyte layer in the film formation step, while the temperature of the second electrode active material layer is maintained in a range prescribed according to the composition of the second electrode active material layer.

It is preferable that the carrier of the energy to be irradiated to the atoms, ions or clusters constituting the solid electrolyte layer is an electron or an electromagnetic wave.

It is also preferable that the temperature for crystallization of the solid electrolyte layer is higher than the melting point of the second electrode active material layer.

It is further preferable that when the solid electrolyte layer is formed, the strength of the energy to be irradiated (strength E (eV)) to the solid electrolyte layer satisfies the relational expression (3):

$$E_a \leq E \leq (70\pm\alpha)\times(\rho_3 d_3)^{1/2}$$

where $-7 \leq \alpha \leq 7$, $E_a$ is activation energy (eV) of the solid electrolyte layer, $\rho_3$ is density (g/cm$^3$) of the second electrode active material layer, and $d_3$ is lattice constant (Å) of the second electrode active material layer.

It is further preferable that power of the energy to be irradiated and power of heat exhausted from the substrate are adjusted so that the temperature of the substrate does not exceed the melting point of the second electrode active material layer when the solid electrolyte layer is formed.

It is preferable that when a solid electrolyte constituting the solid electrolyte layer is an oxide or a nitride, a gas atmosphere containing oxygen or oxygen ions, or an inert gas atmosphere containing nitrogen or nitrogen ions, is used as an atmosphere for vapor-deposition.

Herein, in the preparation method in accordance with the present invention, it is particularly effective that the carrier of the energy to be irradiated to the atoms, ions or clusters constituting the electrode active material is an electron or an electromagnetic wave. Unlike the aforesaid case of the ions in the conventional technique, a mass of an electron is negligible compared with that of an atom and the electron thus has a small function of transferring atoms to be collided, enabling reduction in crystal defect. Further, it is considered that a crystal layer with little crystal defect can be formed since irradiation current density about two orders of magnitude greater than that of ion irradiation is feasible with ease. It is necessary to note, however, that penetrating power of an electron is stronger than that of an ion.

While forming a crystalline electrode active material layer, it is further necessary that the temperature of a solid electrolyte is kept at or below the temperature for crystallization thereof because the solid electrolyte needs to remain amorphous.

With respect to the combination of materials to be used for the first electrode active material layer, the second electrode active material layer and the solid electrolyte layer, the present invention is effectively applicable to a case where the temperature for crystallization of the electrode active material is higher than the temperature for crystallization of the solid electrolyte.

The examples of the materials (electrode active material) to be used for the electrode active material layer which can be used in the present invention and correspond to the above condition may include $LiMO_2$ (M is Co, Ni, Mn, Fe or V), $LiMn_2O_4$, $Li_{1-\alpha}Co_\alpha N$, $V_2O_5$, $Li_3N$ and $Li(Li_{1/3}Ti_{5/3})O_4$. Further, the examples of the solid electrolyte which can be used in the present invention may include lithium nitride phosphate, $Li_2S$—$SiS_2$—$Li_3PO_4$ and $Li_2O$—$V_2O_5$—$SiO_2$.

It is preferable in the present invention that electron energy or photon energy to be used for irradiation satisfies the above expressions (1) to (3). By making the irradiation energy not greater than a prescribed value defined in the above expressions (1) to (3), it is possible to limit the range reached by energy to atoms in the most outer surface layer of the face to be irradiated (base material). On the other hand, Ea is energy (activation energy) to cause occurrence of rearrangement needed for crystallization, and it is considered as being normally on the order of several eV to 60 eV. Irradiation of energy larger than this activation energy makes atoms constituting the layer possible for rearrangement.

Irradiation of energy E satisfying the above expressions (1) to (3) thus causes occurrence of rearrangement of the atoms present only in the most outer surface while the energy is not directly transmitted into the layers under the most outer surface, enabling substantial suppression in thermal damage.

This method also functions effectively in the case of forming the crystalline solid electrolyte. For example, the aforesaid third preparation method in accordance with the present invention makes it possible to form a crystal layer of $Li_3PO_4$—$Li_4SiO_4$ as a crystalline solid electrolyte layer on an electrode active material layer with an extremely low melting point, such as Li.

As a matter of course, when the crystalline solid electrode layer or the current collector layer is formed on the Li layer and, thereon, the crystalline electrode active material is further formed, application of the present invention enables certain formation of the crystalline electrode active material without melting the Li layer.

Moreover, since the preparation method in accordance with the present invention has the effect of activating a gas, application of an atmosphere containing oxygen or nitrogen, for suppressing defect of oxygen or nitrogen occurred in the case of forming an oxidant layer or a nitride layer, allows active introduction of oxygen or nitrogen into the layers. When a crystalline electrode active material or solid electrolyte layer whose constituent is oxygen or nitrogen contained in the atmosphere is formed, the use of energy irradiation enables oxygen or nitrogen in the atmosphere to be in the state of more active ions or plasmas, a stoichiometric ratio of the layer to be obtained to be improved extensively, and a different gas element to be actively introduced into the layer.

The preparation method in accordance with the present invention is also characterized in that the temperature of the substrate is controlled so as not to impair the characteristics of each layer. It is of importance for suppressing crystallization of the solid electrolyte to keep the temperature of the substrate at or below the temperature for crystallization thereof, as stated above. The temperature of the substrate is determined by a difference between energy to be given to the substrate and energy to be given to the outside by the substrate, and hence it is possible to keep the temperature of the substrate at or below the temperature for crystallization of the solid electrolyte by adjustment based on measurement values of the temperatures or the like. It is effective, for example, that a material having a temperature control function is attached to the substrate.

Figure 2:
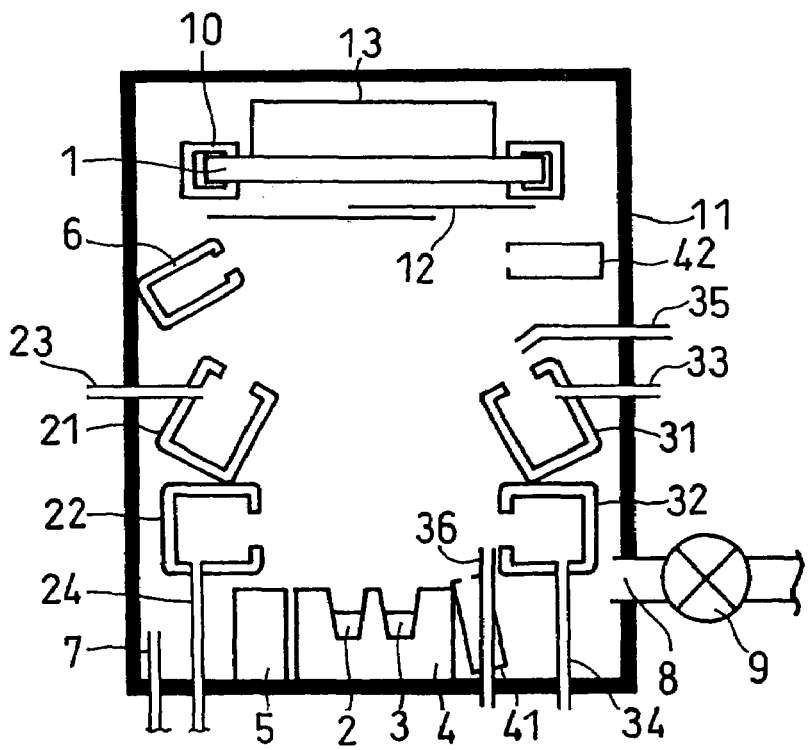
FIG. 2 is a schematic view of another film formation apparatus used in the example of the present invention.

The method for preparing an electrochemical device in accordance with the present invention is described below by reference to drawings. FIGS. 1 and 2 are schematic views demonstrating the structure of apparatus that can be used for implementing the method for preparing an electrochemical device in accordance with the present invention. Inside a vacuum vessel 11 connected to a vacuum pump (not shown) via an outlet pipe 8 and a main valve 9 disposed are a substrate 1 on which a film is formed, supported by a substrate holder 10, vapor-deposition sources 2 and 3, an electron-beam vapor-deposition melting pot 4, an electron gun 5 for electron-beam vapor-deposition, a radiation thermometer 6 for measuring a temperature of a substrate surface, an inlet 7 of ambient gas, the outlet pipe 8, an electron source 21 for irradiating a substrate, an electron source 22 for irradiating clusters and gas, a gas inlet pipe 23 for an electron source for a substrate, a gas inlet pipe 24 for irradiating an electron source for clusters and gas, a plasma source 31 for irradiating a substrate, a plasma source 32 for irradiating clusters and gas, a gas inlet pipe 33 for a plasma source for irradiating a substrate, a gas inlet pipe 34 for an electron source for irradiating clusters and gas, a gas inlet pipe 35 for a plasma source for irradiating a substrate, a gas inlet pipe 36 for an electron source for irradiating clusters and gas, a light source 41 for a substrate, and a light source 42 for clusters and gas. A shutter 12 needs to be deposited in such a position that it shuts off the substrate 1 from the vapor-deposition sources 2 and 3 as well as the energy irradiation apparatuses 21, 22, 31, 32, 41 and 42.

A substrate temperature control device 13 shown in FIG. 2 is effective when a crystal film is formed on the surface of the substrate while thermal damage to the substrate is suppressed by controlling the substrate temperature. In the case of irradiating a large amount of energy by setting film formation at a high rate and using many materials, the substrate temperature control device 13 mainly exerts a cooling function and it is particularly effective in terms of industrial use.

The gas to be introduced to the plasma sources 31 and 32 may be exemplified by Ar, He, Ne and Xe. These inert gases are not aimed at becoming plasmas but at preventing deterioration in hot filament. Further, plasma gas can be generated by supplying gas such as $O_2$ or $N_2$, the atoms of which constitute the aforesaid layer, into the vacuum vessel 11 and then colliding this gas with electrons.

As the light sources 41 and 42 preferably used is a light source capable of emitting light with a wavelength of 12 to 62 nm at a shorter wavelength side. Generally, since gas absorbs light in this wavelength band, a light source not utilizing phenomena of gas discharge, such as a vacuum spark light source (uranium positive electrode: 15 to 40 nm) and a laser induced plasma light source, is used.

For example, Japanese Laid-Open Patent Publication No. Hei 8-287901 describes a deuterium hydrogen lamp using a discharge spectrum of deuterium gas, which emits light with a wavelength of not shorter than 90 nm (13 eV or less on an electron-volt basis) and requires a window material as gas filling is needed. Nevertheless, in the absence of a transparent material in a shorter wavelength range of 100 nm or shorter, it cannot be effectively used either in the conventional technique or the present invention.

The examples of the electrode active material (compound) that can be effectively used in the present invention may include $LiCoO_2$, $LiMn_2O_4$, $LiNiO_2$, $V_2O_5$, $MoO_2$, $TiS_2$, $LiV_2O_5$, $Li_{3-\alpha}Co_\alpha N$, $Li_{3-\alpha}Ni_\alpha N$, $Li_{3-\alpha}Cu_\alpha N$ and $Li_{3-\alpha}Mn_\alpha N$.

When an electrode active material layer expressed by the composition formula: $M_xO_y$, is formed, metal M or oxide $M_x.O_y$. is used as a source. In the case of an electrode active material layer expressed by the composition formula: $LiM_xO_y$, metal Li, lithium oxide or lithium carbonate is used as a source for supply of Li and metal M or oxide $M_x.O_y$. is used as a source for supply of M, since Li relatively has higher vapor pressure as compared with the other metals and there is thus occurred a difference in vapor pressure between metal Li and metal M. As oxygen becomes deficient in the vapor-deposition, a mixed gas obtained by mixing oxygen into an inert gas as the ambient gas to be supplied into by the ambient gas inlet 7. The examples of the inert gas may include He, Ar, Ne, Xe and $N_2$.

As a source for use in the case of forming the electrode active material layer by vapor-deposition, the electrode active material itself may be used or plural elements or a compound constituting the electrode active material layer can also be used. When the electrode active material is a metal oxide, metal or the oxide thereof can be used as the vapor-deposition source. When a compound containing Li is used, however, it is preferable for stable formation of the electrode active material layer that plural vapor-deposition sources, one of which is the Li compound while the other are compounds of other metals, are disposed since the vapor pressure of Li is higher than those of other metals.

In the case of vapor-deposition using an electron beam, it is preferable that pressure inside the vacuum vessel 11 upon beginning of the vapor-deposition is kept on the order of $5\times10^{-5}$ to $1\times10^{-3}$ Torr while 1 to 100 sccm of argon gas is added thereinto by the ambient gas inlet 7.

In the following, the present invention is described more specifically using examples; however, the present invention is not limited thereto.

EXPERIMENTAL EXAMPLE 1

Figure 3:
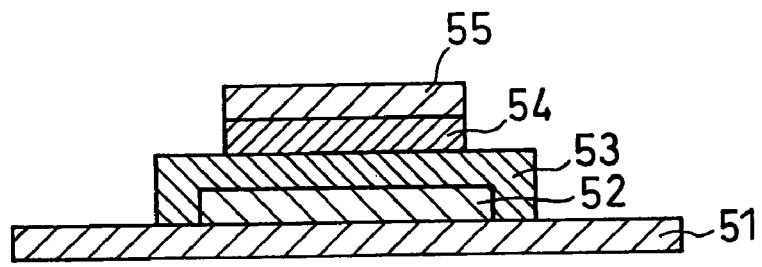
FIG. 3 is a longitudinal sectional view showing the structure of a battery fabricated in the example of the present invention.

The structure of a lithium battery fabricated in the present experimental example was shown in FIG. 3. As shown in FIG. 3, a lithium battery fabricated here comprised a first electrode active material layer 52 made of carbon, a solid electrolyte layer 53 made of $Li_2S$—$SiS_2$—$Li_3PO_4$ and a second electrode active material layer 54 made of $LiCoO_2$. These layers were successively formed on copper foil by the use of the electron-beam vapor-deposition method, to fabricate a lithium battery based on the method for preparing an electrochemical device in accordance with the present invention. The substrate temperature at the time of forming the second electrode active material layer 54, the x-ray diffraction pattern of the second electrode active material layer 54 and the charge/discharge characteristic of the fabricated lithium secondary battery using the aforesaid substrate temperature were evaluated, and from the results of these evaluations, effectiveness of the method for preparing an electrochemical device in accordance with the present invention was confirmed.

Figure 6:
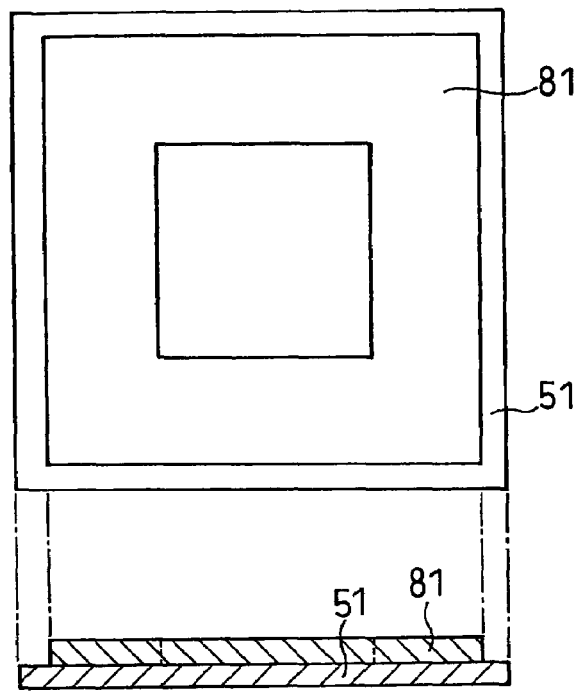
FIG. 6 is a diagram for explanation of the shape and disposed position of a mask for use in patterning of a battery constituent.
Figure 6:

First, as shown in FIG. 6, a mask 81 made of stainless steel foil having a 1.2 cm-square rectangular opening was disposed on a first current collector 51 made of copper foil with a thickness of 15 μm, which was subjected to electron-beam vapor-deposition, using an extrusion-molded carbon material (SEG-R, manufactured by NIPPON CARBON CO.,LTD) as a source, to form a first electrode active material layer 52 made of carbon with a thickness of 2 μm. In FIG. 6 shown was the state of disposition of the mask 81 on the first current collector 51 made of copper foil. The upper surface view thereof was shown in FIG. 6(a), and the side view thereof was shown in FIG. 6(b). Hereupon, an $1\times10^{-4}$ Torr atmosphere of Ar was used, and an accelerating voltage and a current of the irradiation electron beam were 10 kV and 1 A/cm², respectively.

Figure 7:
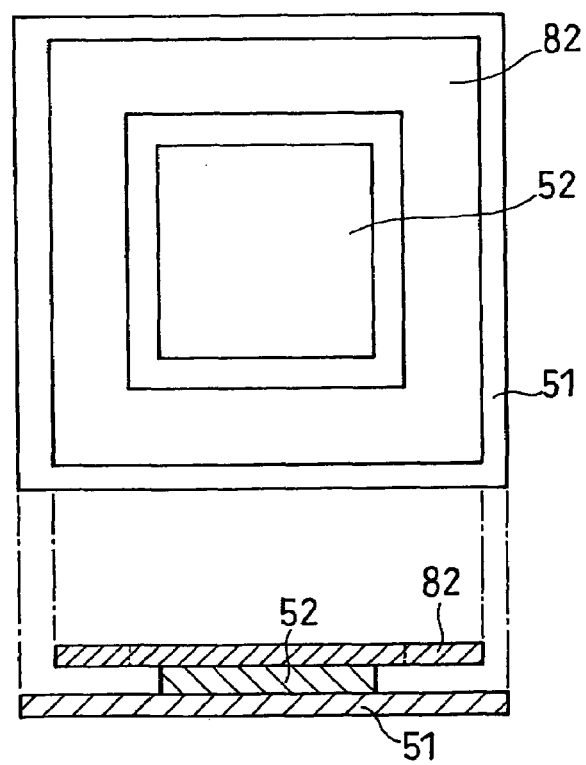
FIG. 7 is a diagram for explanation of the shape and disposed position of another mask for use in patterning of a battery constituent.
Figure 7:
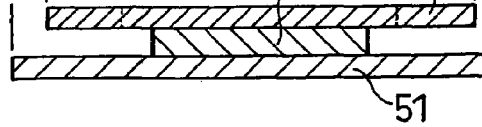

Next, as shown in FIG. 7, a mask 82 made of stainless steel foil having a 1.4 cm-square rectangular opening was disposed on the first electrode active material layer 52, which was subjected to RF magnetron sputtering, using $Li_2S$—$SiS_2$—$Li_3PO_4$ as a target, to form a solid electrolyte layer 53 made of $Li_2S$—$SiS_2$—$Li_3PO_4$ with a thickness of 2 μm. In FIG. 7 shown was the state of disposition of the mask 82 on the first electrode active material layer 52. The upper surface view thereof was shown in FIG. 7(a), and the side view thereof was shown in FIG. 7(b). Hereupon, a $1\times10^{-2}$ Torr atmosphere of Ar was used; a target size was 100 mmφ and a high frequency output was 100 W.

Figure 8:
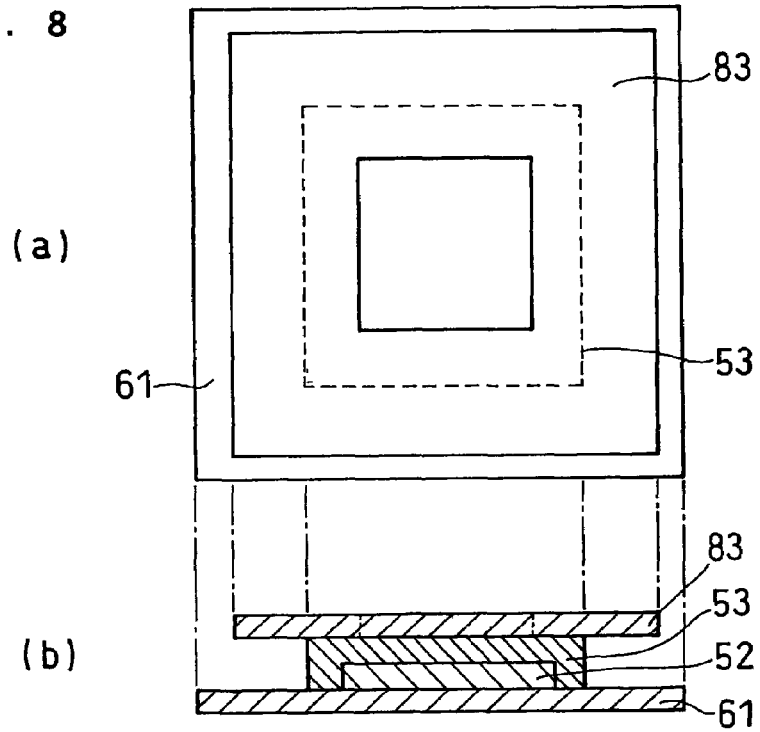
FIG. 8 is a diagram for explanation of the shape and disposed position of still another mask for use in patterning of a battery constituent.

Moreover, as shown in FIG. 8, a mask 83 made of stainless steel foil having a 1 cm-square rectangular opening was disposed on the solid electrolyte layer 53, which was subjected to multi-source electron-beam vapor-deposition, using $Li_2O$ and $Co_3O_4$ as sources, to form a second electrode active material layer 54 made of $LiCoO_2$ with a thickness of 1 μm. In FIG. 8 shown was the state of disposition of the mask 83 on the solid electrolyte layer 53. The upper surface view thereof was shown in FIG. 8(a), and the side view thereof was shown in FIG. 8(b). Hereupon, a $1\times10^{-4}$ Torr atmosphere of a mixed gas containing 50% of Ar and 50% of oxygen was used (supplied by the gas supply pipe 7), and an accelerating voltage and a current of the electron beam to $LiO_2$ were 10 kV and 0.1 A, respectively; an accelerating voltage and a current of the electron beam to $Co_3O_4$ were 10 kV and 1 A, respectively. The distance between the source and the substrate was 600 mm and the opening duration time of the shutter 12 for the film formation was 60 minutes. Conditions for forming the second electrode active material layer 54 were set as shown in Table 1.

It should be noted, as shown in FIG. 1, that: when the substrate was irradiated with electrons, the electron source 21 for irradiating a substrate was used and Ar was introduced out of the gas inlet pipe 23; and when the atmosphere was irradiated with electrons, the electron source 22 for irradiating clusters or gas was used and Ar gas was introduced out of the gas inlet pipe 24.

Further, when the substrate was irradiated with plasmas, the plasma source 31 for irradiating a substrate was used and Ar was introduced out of the gas inlet pipe 33; when the atmosphere was irradiated with plasmas, the plasma source 32 for irradiating clusters or gas was used and Ar was introduced out of the gas inlet pipe 34.

Moreover, when the substrate was irradiated with light, the light source 41 for irradiating a substrate was used; when the atmosphere was irradiated with light, the light source 42 for irradiating an atmosphere was used. It is to be noted that the distance from the substrate to each of the electron source, the plasma source, the vacuum spark light source and the deuterium hydrogen lamp was 100 mm. In the experiment number 15, none of the irradiation apparatuses was used (a conventional example).

Figure 9:
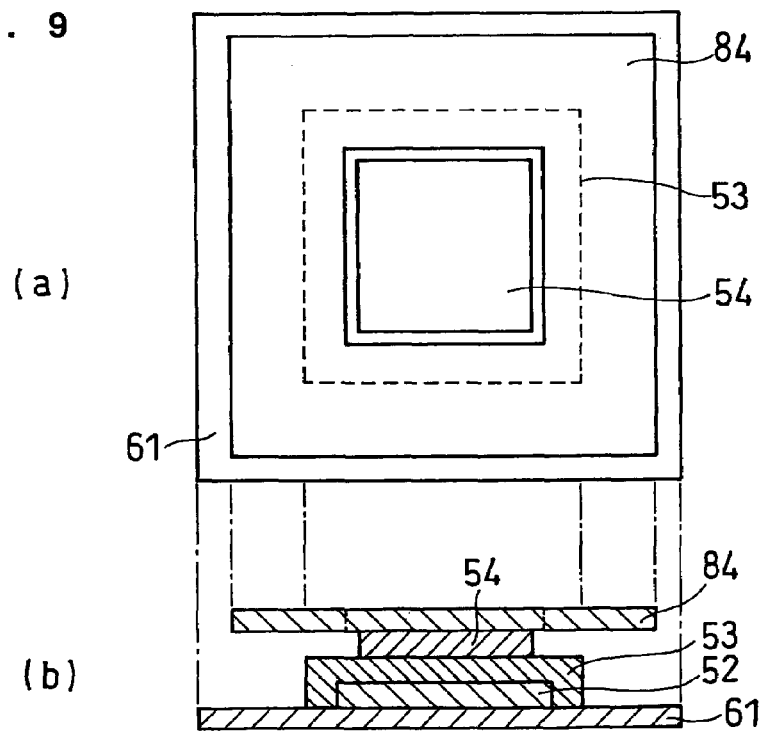
FIG. 9 is a diagram for explanation of the shape and disposed position of still another mask for use in patterning of a battery constituent.

Subsequently, as shown in FIG. 9, a mask 84 made of stainless steel foil having a 1 cm-square rectangular opening was disposed on the second electrode active material layer 54, which was subjected to electron-beam vapor-deposition, using Cu as a source, to form a second current collector made of Cu with a thickness of 3 μm. In FIG. 9 shown was the state of disposition of the mask 84 on the second electrode active material layer 54. The upper surface view thereof was shown in FIG. 9(a), and the side view thereof was shown in FIG. 9(b). Hereupon, a $1\times10^{-4}$ Torr atmosphere of Ar was used, and an accelerating voltage and a current of the electron beam were 10 kV and 1 A/cm², respectively. In the manner described above, lithium secondary batteries were fabricated.

[Evaluation]

(i) As to Second Electrode Active Material layer

The maximum temperature (° C.) of the substrate at the time of forming the second electrode active material layer 54 and the half width at half maximum (deg) in the x-ray diffraction pattern of the second electrode active material layer 54 were measured.

The conditions for forming the second electrode active material layer 54 and the evaluation results were shown in Table 1. It should be noted that in Table 1, "power" refers to: an electron accelerating voltage and an electron current in the case of the irradiation with electrons; an accelerating voltage and an ion current in the case of the irradiation with plasmas; and a light wavelength and an output in the case of the irradiation with light.

As shown in Table 1, during performance of the experiment numbers 1, 3 and 5, the surface temperature of the substrate measured with the use of the radiation thermometer 6 exceeded 350° C. Further, in the experiment numbers 1 to 7, 9 and 11, the half widths at half maximum of diffraction signals of [003], [101] and [104] of the second electrode active material layer made of $LiCoO_2$ were not wider than 0.2°. In the experiment numbers 8, 10, 12, 13 and 15, on the other hand, broad signals were merely observed.

(ii) As to Lithium Secondary Battery

Figure 10:
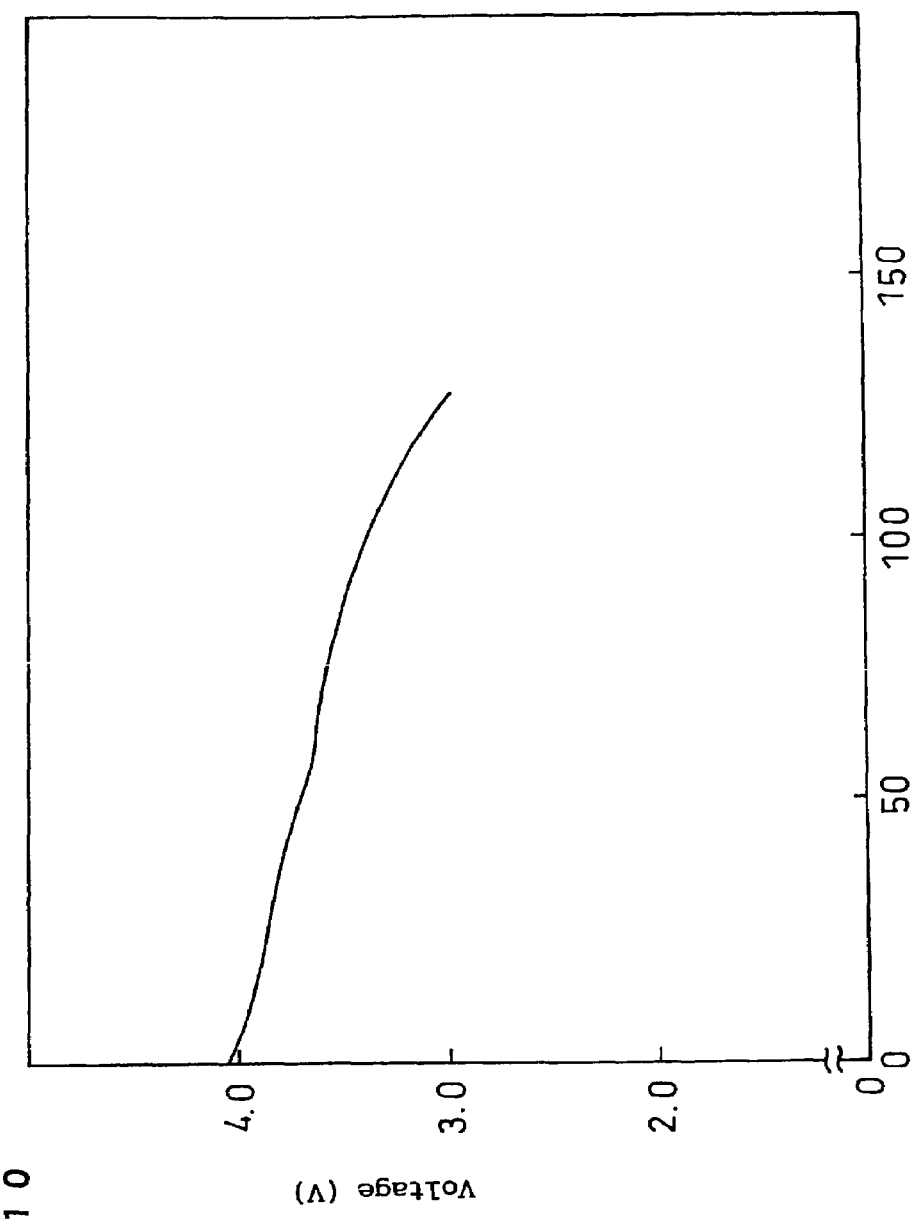
FIG. 10 is a graph showing characteristics of a first battery in accordance with an example of the present invention.

The charge/discharge characteristic of the lithium secondary battery fabricated as described above was evaluated. On condition that an ambient temperature was 20° C. and a current was 0.2 C rate (the current value capable of charging, in five hours, the theoretical capacity (150 mAh/g for $LiCoO_2$) of the battery based on the mass of the first electrode active material layer), the obtained battery was charged up to 4.2 V and subsequently discharged down to 3.0 V at 2 C rate (the current value capable of discharging the theoretical capacity of the battery in half an hour). The discharge capacity per unit weight of the first electrode active material at the fifth cycle was shown in Table 1. The discharge carve at the fifth cycle was shown in FIG. 10.

The x-ray diffraction pattern indicates that, among the experiments expected to have obtained a first electrode active material layer relatively excellent in crystallinity, the discharge capacities of the experiment numbers 1 to 6 were favorable, whereas those of the experiment numbers 7, 9 and 11 decreased. In this instance, the decrease in capacity is considered as being resulted from the fact that the irradiation with electrons with an accelerating voltage of 200 V raised the temperature of the solid electrolyte layer 53, which induced crystallization of the solid electrolyte layer 53 to cause a decrease in ionic conductivity. In the experiment numbers 8, 10, 12, 13 and 14, the capacities decreased to a large degree, which, presumably, is because the crystallinity of the second electrode active material layer made of $LiCoO_2$ was low.

TABLE 1

| | Condition for forming second electrode active material layer 54 | | | | | Evaluation result | |
|---|---|---|---|---|---|---|---|
| Irradiation source | Object of irradiation | Power | Atmosphere | Gas introduced to irradiation source (flow rate) | Substrate temperature (° C.) | XRD half width at half maximum (deg) | Capacity (mAh/g) |
| 1 Electron | Substrate | 40 V, 2 A | $Ar + O_2$ | Ar (5 sccm) | 265 | 0.10 | 124 |
| 2 Electron | Atmosphere | 40 V, 2 A | $Ar + O_2$ | Ar (5 sccm) | 240 | 0.11 | 123 |
| 3 Plasma | Substrate | 40 V, 2 A | $Ar + O_2$ | Ar (5 sccm) | 260 | 0.12 | 119 |
| 4 Plasma | Atmosphere | 40 V, 2 A | $Ar + O_2$ | Ar (5 sccm) | 243 | 0.10 | 125 |
| 5 Light (Vacuum spark light source) | Substrate | 15~40 nm (80 W) | $Ar + O_2$ | — | 240 | 0.12 | 118 |
| 6 Light (Vacuum spark light source) | Atmosphere | 15~40 nm (80 W) | $Ar + O_2$ | — | 220 | 0.10 | 123 |
| 7 Electron | Substrate | 200 V, 2 A | $Ar + O_2$ | Ar (5 sccm) | 354 | 0.09 | 68 |
| 8 Electron | Substrate | 10 V, 2 A | $Ar + O_2$ | Ar (5 sccm) | 160 | 1.50 | 55 |
| 9 Electron | Atmosphere | 200 V, 2 A | $Ar + O_2$ | Ar (5 sccm) | 360 | 0.09 | 72 |
| 10 Electron | Atmosphere | 10 V, 2 A | $Ar + O_2$ | Ar (5 sccm) | 150 | 1.80 | 40 |
| 11 Plasma | Substrate | 200 V, 2 A | $Ar + O_2$ | Ar (5 sccm) | 355 | 0.08 | 70 |
| 12 Plasma | Substrate | 10 V, 2 A | $Ar + O_2$ | Ar (5 sccm) | 152 | 1.85 | 62 |
| 13 Light (Deuterium lamp) | Substrate | 250~400 nm (80 W) | $Ar + O_2$ | — | 170 | 2.00 | 38 |
| 14 Light (Deuterium lamp) | Atmosphere | 250~400 nm (80 W) | $Ar + O_2$ | — | 162 | 1.85 | 42 |
| 15 None | — | — | $Ar + O_2$ | — | 89 | — | 10 |

EXPERIMENTAL EXAMPLE 2

In the present experimental example investigated was the effect of using oxygen as a gas to be introduced into the irradiation source when the second electrode active material layer 54 was formed.

Except that the conditions shown in Table 2 were set at the time of forming the second electrode active material layer 54, lithium secondary batteries were fabricated in the same manner as in Experimental example 1.

It is to be noted that in the experiment numbers 16 and 17, Ar gas was introduced out of the gas inlet pipes 23 and 33, respectively, at a flow rate of 5 sccm, and a mixed gas containing 50% of Ar and 50% of $O_2$ (10 sccm) was supplied by the gas inlet pipes 7 and 35, respectively, to adjust ambient pressure to be $1\times10^{-2}$ Torr.

Further, in the experiment number 18 and 19, Ar gas was introduced out of the gas inlet pipes 23 and 33, respectively, at a flow rate of 5 sccm, and a mixed gas containing 50% of Ar and 50% of $O_2$ (10 sccm) was supplied by the gas inlet pipes 7 and 35, respectively, to adjust ambient pressure to be $1\times10^{-2}$ Torr.

Moreover, in the same manner as in Experimental example 1, a second current collector 55 made of Cu with a thickness of 3 μm was formed to fabricate a lithium secondary battery.

[Evaluation]

(i) As to Composition of Second Electrode Active Material Layer

The composition of the first electrode active material layer 54 formed in the present experiment was analyzed by ICP infra-red emission spectroscopy. In the experiment numbers 16 and 17, the atomic ratio of Li:Co:O was close to 1:1:2, whereas in the case of the experiment numbers 18 and 19, the ratio of O was about 1.7, indicating a tendency for oxygen to be a little deficient. It was found that the presence of oxygen or oxygen ions on the surface of the film to be formed is effective as a preventive measure against deficiency of oxygen in the layer.

Further, from the fact that there was observed no significant difference between the experiment numbers 16 and 17, it was confirmed that also in the case of the irradiation with electrons in the experiment number 16, oxygen became active to be easily incorporated as constituent atoms, as in the case of the experiment number 17.

(ii) As to Lithium Secondary Battery

Furthermore, the charge/discharge characteristic of the obtained lithium secondary battery was evaluated in the same manner as in Experimental example 1. The results were shown in Table 2.

In the experiment numbers 16 and 17, the results were favorable, whereas in the experiment numbers 18 and 19, the capacity decreased, whereby it was thought that deficiency of oxygen had exerted an effect on the battery characteristics.

Experimental example 1. Further, a current value of irradiation energy was 2 A in all the cases.

It was found from Table 3 that the half width at half maximum of the x-ray diffraction signal consistently became narrower with increasing accelerating voltage of the electrons to be irradiated, indicating improvement in crystallinity. As opposed to this, the battery capacity was improved with increasing accelerating voltage in the range of the substrate temperature of not higher than 300° C.; the battery capacity exhibited a tendency to begin decreasing around the point that the substrate temperature exceeded 300° C. Presumably, this was because an increase in irradiation energy along with increasing accelerating voltage was followed by a rise in substrate temperature, which induced crystallization of the solid electrolyte to cause a decrease in ionic conductivity. It was indicative of the necessity to take a means of exhausting heat from the substrate as a measure against the increased irradiation energy.

TABLE 3

| Electron accelerating voltage (V) | Substrate temperature (° C.) | XRD half width at half maximum (deg) | Capacity (mAh/g) |
|---|---|---|---|
| 20 | 5 | 121 | 3.10 | 12 |
| 21 | 10 | 160 | 1.70 | 55 |
| 22 | 20 | 205 | 0.60 | 90 |
| 23 | 30 | 228 | 0.25 | 101 |
| 24 | 40 | 265 | 0.10 | 124 |
| 25 | 50 | 281 | 0.10 | 126 |
| 26 | 90 | 314 | 0.10 | 115 |
| 27 | 100 | 319 | 0.10 | 107 |
| 28 | 110 | 322 | 0.10 | 98 |
| 29 | 200 | 354 | 0.09 | 68 |

EXPERIMENTAL EXAMPLE 4

In the present experimental example, except that $Li_2O$—$V_2O_5$—$SiO_2$ was used as a material constituting the solid

TABLE 2

| | Condition for forming second electrode active material layer 54 | | | | Evaluation result | | | |
|---|---|---|---|---|---|---|---|---|
| | Irradiation source | Direction of irradiation | Power | Atmosphere | Gas introduced to irradiation gas(flow rate) | Atomic ratio (Li:Co:O) | | Capacity (mAh/g) |
| | | | | | | Li | Co | O | |
| 16 | Electron | Substrate | 40 V, 2 A | Ar | Ar + $O_2$ | 0.96 | 1.00 | 2.01 | 125 |
| 17 | Plasma | Substrate | 40 V, 2 A | Ar | Ar + $O_2$ | 0.98 | 1.00 | 1.98 | 125 |
| 18 | Electron | Substrate | 40 V, 2 A | Ar | Ar | 1.10 | 1.00 | 1.70 | 106 |
| 19 | Plasma | Substrate | 40 V, 2 A | Ar | Ar | 1.05 | 1.00 | 1.76 | 95 |

EXPERIMENTAL EXAMPLE 3

When the second electrode active material layer 54 made of $LiCoO_2$ was formed on the solid electrolyte layer 53 made of $Li_2S$—$SiS_2$—$Li_3PO_4$, the accelerating voltage of the irradiated electrons was changed to those values shown in Table 3. The substrate temperature and the half width at half maximum of the x-ray diffraction signal at that time, as well as the results of the charge/discharge characteristic of the finally-obtained lithium secondary battery, were shown in Table 3. It is to be noted that conditions were the same as those in electrolyte layer 53 and conditions for forming the second electrode active material layer 54 were set as shown in Table 4, experiments were performed in almost the same manner as in Experimental example 1.

On a first current collector 51 made of copper foil with a thickness of 15 μm, electron-beam vapor-deposition was performed using an extrusion-molded carbon material (SEG-R, manufactured by NIPPON CARBON CO.,LTD) as a source, to form a first electrode active material layer 52 made of carbon with a thickness of 2.2 μm. Hereupon, an $1\times10^{-4}$ Torr atmosphere of Ar gas was used, and an accelerating voltage and a current of the irradiation electron beam were 10 kV and 1 A, respectively.

Next, on the first electrode active material layer 52, high frequency magnetron sputtering was performed using $Li_2O$—$V_2O_5$—$SiO_2$ as a target, to form a solid electrolyte layer 53 made of $Li_2O$—$V_2O_5$—$SiO_2$ with a thickness of 2 μm. Hereupon, a $1\times10^{-2}$ Torr atmosphere of Ar gas was used, and a target size was 100 mmϕ and a high frequency output was 100 W.

Next, on the solid electrolyte layer 53, multi-source electron-beam vapor-deposition was performed using $Li_2O$ and $NiO_2$ as sources, to form a second electrode active material layer 54 made of a $LiNiO_2$ layer with a thickness of 1 μm. Hereupon, a $1\times10^{-4}$ Torr atmosphere of a mixed gas containing 50% of Ar and 50% of oxygen was used, and an accelerating voltage and a current of the electron beam to $LiO_2$ were 10 kV and 0.08 A, respectively; an accelerating voltage and a current of the electron beam to $NiO_2$ were 10 kV and 0.9 A, respectively.

Conditions for forming the second electrode active material layer 54 were set as shown in Table 4, and lithium secondary batteries were fabricated in the same manner as in Experimental example 1.

[Evaluation]

The conditions for forming the second electrode active material layer 54 and the evaluation results were shown in Table 4. As revealed from Table 4, during performance of the experiment numbers 36, 38 and 40, the surface temperature measured with the radiation thermometer 6 exceeded 350° C. Further, in the experiment numbers 30 to 36, 38 and 40, the half widths at half maximum of diffraction signals of [003], [101] and [104] of $LiNiO_2$ were not wider than 0.4°. In the experiment numbers 37, 39 and 41 to 43, on the other hand, broad signals were merely observed.

Figure 11:
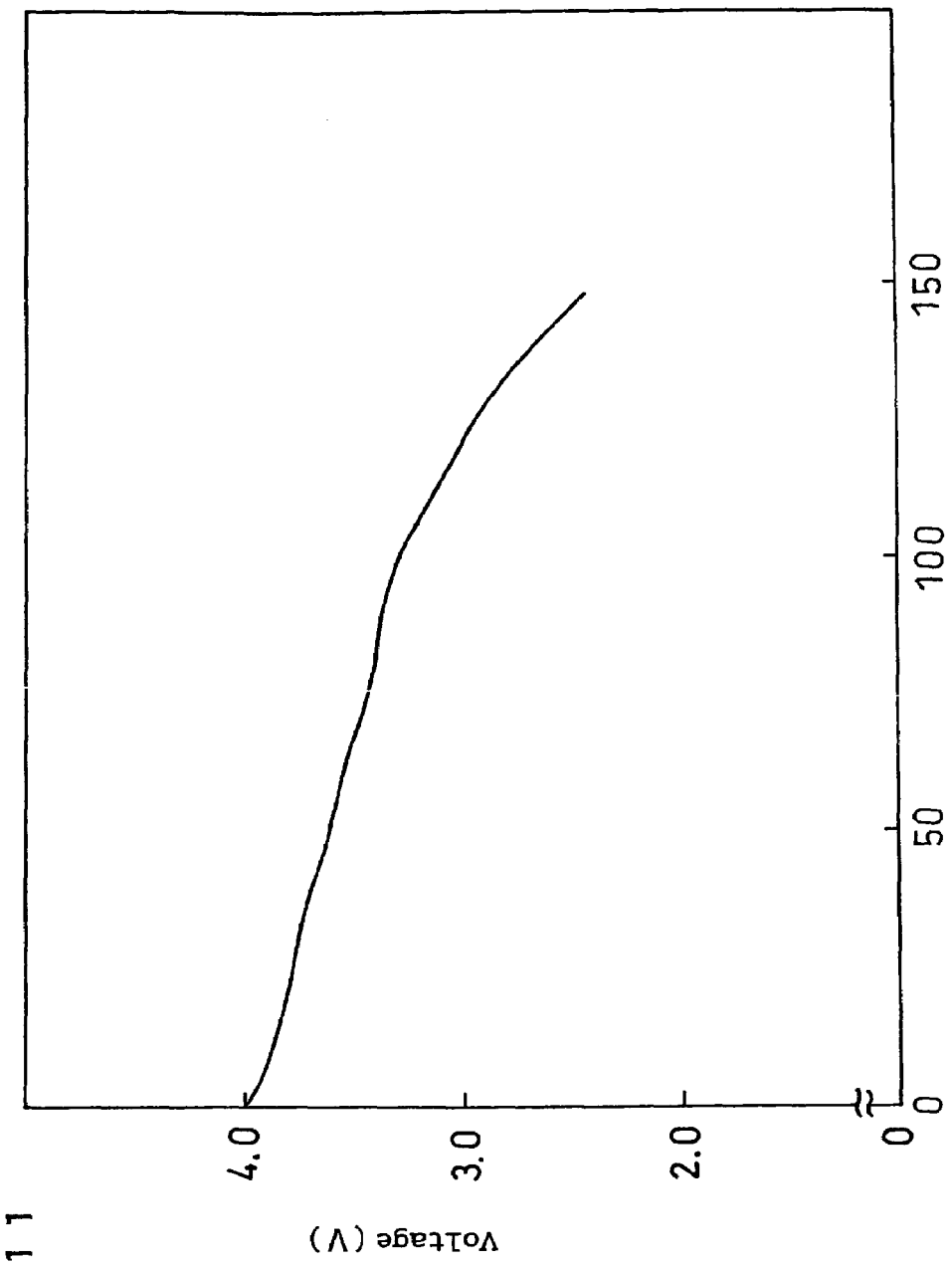
FIG. 11 is a graph showing characteristics of a first battery in accordance with an example of the present invention.

Further, except that the battery was discharged until the voltage reached 2.5 V, the discharge capacity of the battery was measured in the same manner as in Experimental example 1. The discharge capacity per weight of the first electrode active material at the fifth cycle was shown in Table 4. The discharge carve at the fifth cycle was shown in FIG. 11.

The x-ray diffraction pattern indicates that, among the experiment numbers expected to have obtained a second electrode active material layer 54 relatively excellent in crystallinity, the capacities of the experiment numbers 30 to 35 were almost identical and thus favorable, whereas those of the experiment numbers 36, 38 and 40 decreased. The decrease in capacity was considered as being resulted from the fact that the irradiation with electrons with an accelerating voltage of 200 V raised the temperature of the second electrode active material layer 54, which induced crystallization of the second electrode active material layer 54 to cause a decrease in ionic conductivity. In the experiment numbers 37, 39 and 41 to 43, the capacities decreased to a large degree, which, presumably, was because the crystallinity of the second electrode active material layer 54 made of $LiNiO_2$ was low.

TABLE 4

| | Condition for forming second electrode active material layer 54 | | | | | Evaluation result | | |
|---|---|---|---|---|---|---|---|---|
| | Irradiation source | Object of irradiation | Power | Atmosphere | Gas introduced to irradiation source (flow rate) | Substrate temperature (° C.) | XRD half width at half maximum (deg) | Capacity (mAh/g) |
| 30 | Electron | Substrate | 32 V, 2 A | Ar + $O_2$ | Ar (5 sccm) | 205 | 0.22 | 142 |
| 31 | Electron | Atmosphere | 32 V, 2 A | Ar + $O_2$ | Ar (5 sccm) | 198 | 0.25 | 141 |
| 32 | Plasma | Substrate | 32 V, 2 A | Ar + $O_2$ | Ar (5 sccm) | 215 | 0.23 | 131 |
| 33 | Plasma | Atmosphere | 32 V, 2 A | Ar + $O_2$ | Ar (5 sccm) | 216 | 0.23 | 145 |
| 34 | Light (Vacuum spark light source) | Substrate | 15~40 nm (70 W) | Ar + $O_2$ | — | 203 | 0.32 | 139 |
| 35 | Light (Vacuum spark light source) | Atmosphere | 15~40 nm (70 W) | Ar + $O_2$ | — | 200 | 0.29 | 141 |
| 36 | Electron | Substrate | 200 V, 2 A | Ar + $O_2$ | Ar (5 sccm) | 350 | 0.10 | 105 |
| 37 | Electron | Substrate | 10 V, 2 A | Ar + $O_2$ | Ar (5 sccm) | 158 | 1.69 | 92 |
| 38 | Electron | Atmosphere | 200 V, 2 A | Ar + $O_2$ | Ar (5 sccm) | 355 | 0.09 | 106 |
| 39 | Electron | Atmosphere | 10 V, 2 A | Ar + $O_2$ | Ar (5 sccm) | 152 | 1.82 | 90 |
| 40 | Plasma | Substrate | 200 V, 2 A | Ar + $O_2$ | Ar (5 sccm) | 358 | 0.08 | 102 |
| 41 | Plasma | Substrate | 10 V, 2 A | Ar + $O_2$ | Ar (5 sccm) | 148 | 2.05 | 88 |
| 42 | Light (Deuterium lamp) | Substrate | 250~400 nm (80 W) | Ar + $O_2$ | — | 166 | 1.80 | 85 |
| 43 | Light (Deuterium lamp) | Atmosphere | 250~400 nm (80 W) | Ar + $O_2$ | — | 164 | 1.60 | 90 |

EXPERIMENTAL EXAMPLE 5

In the present experimental example, a lithium secondary battery was fabricated which had the structure shown in FIG. 3 and comprised a first electrode active material layer 52 made of $Li(Li_{1/3}Ti_{5/3})O_4$, a solid electrolyte layer 53 made of $Li_{2.9}PO_{3.3}N_{0.36}$, a second electrode active material layer 54 made of $LiMn_2O_4$ and a second current collector 55 made of Cu. These layers were successively formed on copper foil by the use of electron-beam vapor-deposition, to fabricate a lithium secondary battery in almost the same manner as in Experimental example 1.

First, on a first current collector 51 made of copper foil with a thickness of 15 μm, multi-source electron-beam vapor-deposition was performed using $Li_2O$ and $TiO_2$ as sources, to form a first electrode active material layer 52 made of Li($Li_{1/3}Ti_{5/3}$)$O_4$ with a thickness of 2.5 μm. Hereupon, an $1\times10^{-4}$ Torr atmosphere of Ar plus oxygen (mixing ratio 1:1) was used, and an accelerating voltage and a current of the irradiation electron beam to $Li_2O$ were 10 kV and 0.1 A, respectively; an accelerating voltage and a current of the irradiation electron beam to $TiO_2$ were 10 kV and 1 A, respectively.

Subsequently, on the aforesaid first electrode active material layer 52, high frequency magnetron sputtering was performed using $Li_3PO_4$ as a target, to form a solid electrolyte layer 53 made of $Li_{2.9}PO_{3.3}N_{0.36}$ with a thickness of 2 μm. Hereupon, a $1\times10^{-2}$ Torr atmosphere of $N_2$ gas was used, and a target size was 100 mmφ and a high frequency output was 100 W.

On the solid electrolyte layer 53, multi-source electron-beam vapor-deposition was performed using $Li_2O$ and $MnO_2$ as sources, to form a second electrode active material layer 54 made of $LiMn_2O_4$ with a thickness of 2 μm. Hereupon, a $1\times10^{-4}$ Torr atmosphere of a mixed gas containing 50% of Ar and 50% of oxygen was used, and an accelerating voltage and a current of the electron beam to $Li_2O$ were 10 kV and 0.1 A, respectively; an accelerating voltage and a current of the electron beam to $MnO_2$ were 10 kV and 1 A, respectively. Patterning in the aforesaid process was performed in the same manner as in Experimental example 1. Further, lithium secondary batteries were fabricated in the same manner as in Experimental example 1.

[Evaluation]

The conditions for forming the second electrode active material layer 54 and the evaluation results were shown in Table 5. As revealed from Table 5, during performance of the experiment numbers 50, 52, and 54, the surface temperature measured with the radiation thermometer 6 exceeded 350° C. Further, in the experiment numbers 44 to 50, 52 and 54, the half widths at half maximum of diffraction signal of [111] of $LiMnO_2$ were not wider than 0.2°. In the experiment numbers 51, 53 and 55 to 57, on the other hand, broad signals were merely observed.

Figure 12:
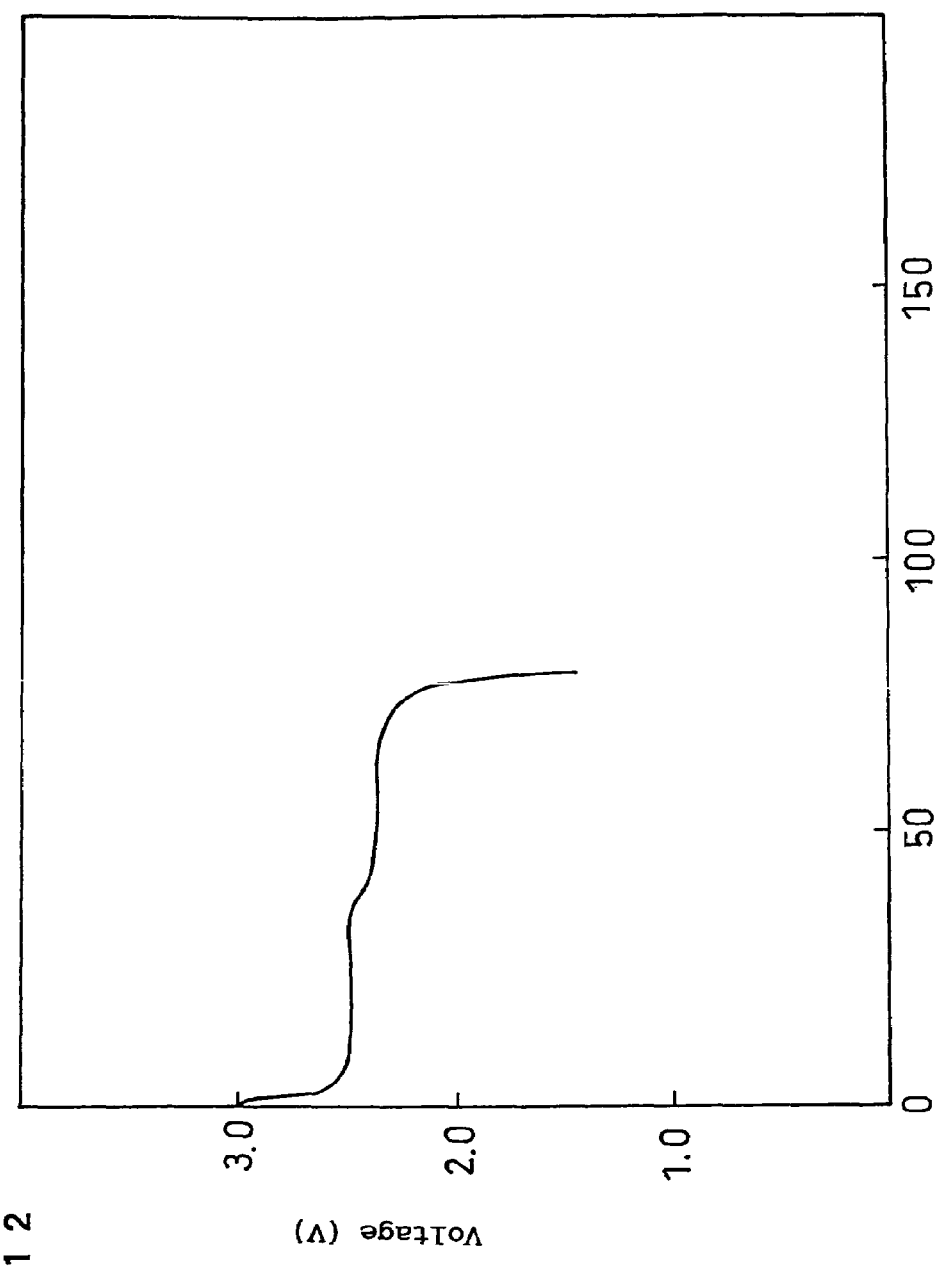
FIG. 12 is a graph showing characteristics of a first battery in accordance with an example of the present invention.

Further, except that the battery was charged up to 3.1 V and then discharged down to 1.5 V, the discharge capacity of the battery was measured in the same manner as in Experimental example 1. The discharge capacity per weight of the first electrode active material at the fifth cycle was shown in Table 5. The discharge carve at the fifth cycle was shown in FIG. 12.

The x-ray diffraction pattern indicates that, among the experiment numbers expected to have obtained a second electrode active material layer 54 relatively excellent in crystallinity, the capacities of the experiment numbers 44 to 49 were almost identical and thus favorable, whereas those of the experiment numbers 50, 52 and 54 decreased. The decrease in capacity was considered as being resulted from the fact that the irradiation with electrons with an accelerating voltage of 200 V raised the temperature of the second electrode active material layer 54, which induced crystallization of the second electrode active material layer 54 to cause a decrease in ionic conductivity. In the experiment numbers 51, 53 and 55 to 57, the capacities decreased to a large degree, which, presumably, was because the crystallinity of the second electrode active material layer 54 made of $LiMnO_2$ was low.

TABLE 5

| | Condition for forming second electrode active material layer 54 | | | | | Evaluation result | |
|---|---|---|---|---|---|---|---|
| | Irradiation source | Object of irradiation | Power | Atmosphere | Gas introduced to irradiation source (flow rate) | Substrate temperature (° C.) | XRD half width at half maximum (deg) | Capacity (mAh/g) |
| 44 | Electron | Substrate | 45 V, 2 A | Ar + $O_2$ | Ar (5 sccm) | 278 | 0.10 | 96 |
| 45 | Electron | Atmosphere | 45 V, 2 A | Ar + $O_2$ | Ar (5 sccm) | 261 | 0.14 | 90 |
| 46 | Plasma | Substrate | 45 V, 2 A | Ar + $O_2$ | Ar (5 sccm) | 270 | 0.12 | 94 |
| 47 | Plasma | Atmosphere | 45 V, 2 A | Ar + $O_2$ | Ar (5 sccm) | 259 | 0.13 | 94 |
| 48 | Light (Vacuum spark light source) | Substrate | 15~40 nm (80 W) | Ar + $O_2$ | — | 242 | 0.12 | 95 |
| 49 | Light (Vacuum spark light source) | Atmosphere | 15~40 nm (80 W) | Ar + $O_2$ | — | 224 | 0.16 | 88 |
| 50 | Electron | Substrate | 200 V, 2 A | Ar + $O_2$ | Ar (5 sccm) | 350 | 0.09 | 61 |
| 51 | Electron | Substrate | 10 V, 2 A | Ar + $O_2$ | Ar (5 sccm) | 163 | 1.50 | 52 |
| 52 | Electron | Atmosphere | 200 V, 2 A | Ar + $O_2$ | Ar (5 sccm) | 361 | 0.09 | 63 |
| 53 | Electron | Atmosphere | 10 V, 2 A | Ar + $O_2$ | Ar (5 sccm) | 147 | 1.80 | 50 |
| 54 | Plasma | Substrate | 200 V, 2 A | Ar + $O_2$ | Ar (5 sccm) | 355 | 0.08 | 62 |
| 55 | Plasma | Substrate | 10 V, 2 A | Ar + $O_2$ | Ar (5 sccm) | 155 | 1.85 | 48 |
| 56 | Light (Deuterium lamp) | Substrate | 250~400 nm (80 W) | Ar + $O_2$ | — | 180 | 2.00 | 44 |
| 57 | Light (Deuterium lamp) | Atmosphere | 250~400 nm (80 W) | Ar + $O_2$ | — | 167 | 1.85 | 45 |

EXPERIMENTAL EXAMPLE 6

Also in the present example, experiments almost the same as the experiments of the experiment numbers 1 to 6 in Experimental example 1 were performed. Further, lithium secondary batteries were fabricated in the same manner as in Experimental example 1.

On a first current collector 51 made of copper foil with a thickness of 15 μm, electron-beam vapor-deposition was performed using $Li_3N$ and Co as sources, to form a first electrode active material layer 52 made of $Li_{3-\alpha}Co_\alpha N$ with a thickness of 1.4 μm. It was preferable here that α satisfied $0.2 \leq \alpha \leq 0.6$, and a particularly preferable a was 0.4. Hereupon, an $1 \times 10^{-4}$ Torr atmosphere of $N_2$ gas was used, and an accelerating voltage and a current of the electron beam to $Li_3N$ were 10 kV and 0.25 A, respectively; an accelerating voltage and a current of the electron beam to Co were 10 kV and 1 A, respectively. A film was formed while irradiating electrons with the use of the electron source 21 for irradiating a substrate. Conditions of the electron source 21 for irradiating a substrate were that an electron accelerating voltage was 40 V, an electron current was 2 A and a flow rate of nitrogen out of the gas inlet pipe 23 was 5 sccm.

Next, on the first electrode active material layer 52, high frequency magnetron sputtering was performed using $Li_2S$—$SiS_2$—$Li_3PO_4$ as a target, to form a solid electrolyte layer 53 made of $Li_2S$—$SiS_2$—$Li_3PO_4$ with a thickness of 2 μm. Hereupon, a $1 \times 10^{-2}$ Torr atmosphere of Ar gas was used, and a target size was 100 mmϕ and a high frequency output was 100 W.

Furthermore, on the solid electrolyte layer 53, electron-beam vapor-deposition was performed using vanadium as a source, to form a second electrode active material layer 54 made of $V_2O_5$ with a thickness of 4 μm. This second electrode active material layer 54 was formed in such a manner that a stainless steel-made mask (thickness 20 μm) having a 1 cm-square aperture therein was disposed tightly on the solid electrolyte layer 53 to form a layer of c-$V_2O_5$ in the shape of a 1 cm-square rectangular. Hereupon, a $1 \times 10^{-4}$ Torr atmosphere of a mixed gas containing Ar and $O_2$ (1:1) was used, and an accelerating voltage and a current of the electron beam to vanadium were 2010 kV and 0.1 A, respectively.

Subsequently, on the second electrode active material layer 54 in the shape of a 1 cm-square rectangular formed in the aforesaid manner, electron-beam vapor-deposition was performed using Cu as a source, to form a second current collector 55 made of Cu with a thickness of 3 μm. At this time, a stainless steel-made mask (thickness 20 μm) having a 1 cm-square quadrate opening therein was disposed tightly on the solid electrolyte layer 53, and the second current collector 55 made of Cu was formed in the shape of a 1 cm-square rectangular in a state that the second current collector 55 was laminated on the second electrode active material layer 54. Hereupon, a $1 \times 10^{-4}$ Torr atmosphere of Ar gas was used, and an accelerating voltage and a current of the electron beam were 10 kV and 1 A, respectively. By this means, lithium secondary batteries were fabricated.

[Evaluation]

Conditions for forming the second electrode active material layer 54 were set and the evaluations thereof were performed in the same manner as in Experimental example 1. The results were shown in Table 6. As shown in Table 6, during performance of the experiment numbers 59, 61 and 63, the surface temperature measured with the infra-red radiation thermometer 6 exceeded 350° C. Further, in the experiment numbers 58 to 64, 66 and 68, the half widths at half maximum of diffraction signals of [200], [221], [240] and the like of $V_2O_5$ were not wider than 0.2°. In the experiment numbers 65, 67 and 69 to 71, on the other hand, broad signals were merely observed.

Figure 13:
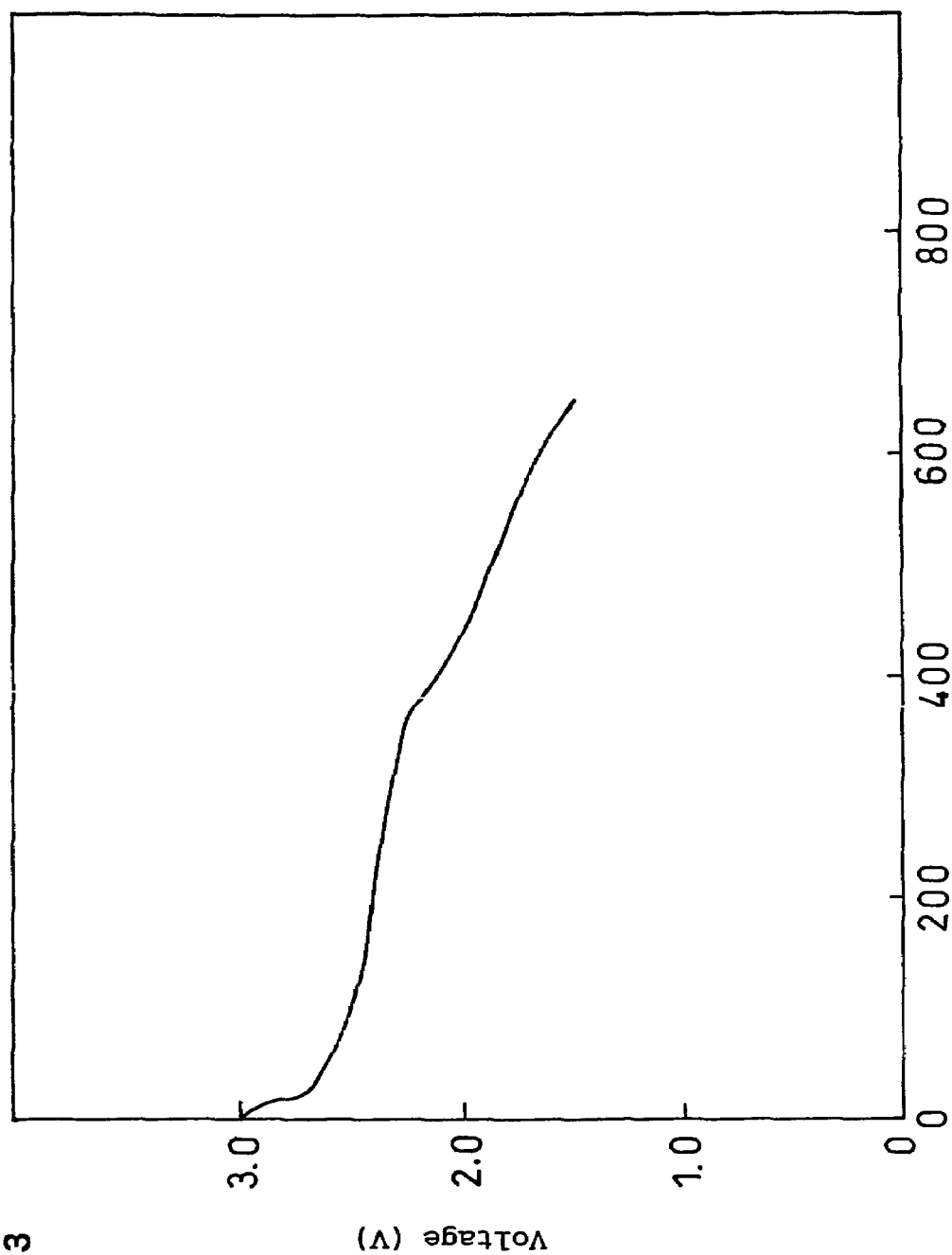
FIG. 13 is a graph showing characteristics of a first battery in accordance with an example of the present invention.

Further, at an ambient temperature of 20° C., the obtained lithium secondary battery was charged up to 3.2 V at 0.2 C rate (the current value capable of charging the theoretical capacity of the battery in five hours) and then discharged down to 1.5 V at 2 c rate (the current value capable of discharging the theoretical capacity of the battery in half an hour). The discharge capacity per weight of the second electrode active material at the fifth cycle was shown in Table 6. The discharge carve at the fifth cycle was shown in FIG. 13.

The x-ray diffraction pattern indicates that, among the experiment numbers having obtained a first electrode active material relatively excellent in crystallinity, the capacities of the experiment numbers 58 to 63 were almost identical and thus favorable, whereas those of the experiment numbers 64, 66 and 68 decreased. The decrease in capacity was considered as being resulted from the fact that the irradiation with electrons with an accelerating voltage of 200 V raised the temperature of the second electrode active material layer 54, which induced crystallization of the second electrode active material layer 54 to cause a decrease in ionic conductivity. In the experiment numbers 65, 67 and 69 to 71, the capacities decreased to a large degree, which was presumably attributed to insufficient crystallinity of the second electrode active material layer 54 made of c-$V_2O_5$.

TABLE 6

| | Condition for forming second electrode active material layer 54 | | | | | Evaluation result | |
|---|---|---|---|---|---|---|---|
| | Irradiation source | Object of irradiation | Power | Atmosphere | Gas introduced to irradiation source (flow rate) | Substrate temperature (° C.) | XRD half width at half maximum (deg) | Capacity (mAh/g) |
| 58 | Electron | Substrate | 40 V, 2 A | Ar + $O_2$ | Ar (5 sccm) | 263 | 0.11 | 631 |
| 59 | Electron | Atmosphere | 40 V, 2 A | Ar + $O_2$ | Ar (5 sccm) | 245 | 0.11 | 619 |
| 60 | Plasma | Substrate | 40 V, 2 A | Ar + $O_2$ | Ar (5 sccm) | 259 | 0.12 | 622 |
| 61 | Plasma | Atmosphere | 40 V, 2 A | Ar + $O_2$ | Ar (5 sccm) | 249 | 0.10 | 650 |
| 62 | Light (Vacuum spark light source) | Substrate | 15~40 nm (80 W) | Ar + $O_2$ | — | 240 | 0.12 | 623 |
| 63 | Light (Vacuum spark light source) | Atmosphere | 15~40 nm (80 W) | Ar + $O_2$ | — | 225 | 0.11 | 634 |
| 64 | Electron | Substrate | 200 V, 2 A | Ar + $O_2$ | Ar (5 sccm) | 357 | 0.09 | 480 |
| 65 | Electron | Substrate | 10 V, 2 A | Ar + $O_2$ | Ar (5 sccm) | 166 | 1.60 | 430 |
| 66 | Electron | Atmosphere | 200 V, 2 A | Ar + $O_2$ | Ar (5 sccm) | 363 | 0.09 | 485 |
| 67 | Electron | Atmosphere | 10 V, 2 A | Ar + $O_2$ | Ar (5 sccm) | 150 | 1.90 | 413 |
| 68 | Plasma | Substrate | 200 V, 2 A | Ar + $O_2$ | Ar (5 sccm) | 359 | 0.09 | 473 |

TABLE 6-continued

| | | Condition for forming second electrode active material layer 54 | | | Evaluation result | | |
|---|---|---|---|---|---|---|---|
| | Irradiation source | Object of irradiation | Power | Atmosphere | Gas introduced to irradiation source (flow rate) | Substrate temperature (° C.) | XRD half width at half maximum (deg) | Capacity (mAh/g) |
| 69 | Plasma | Substrate | 10 V, 2 A | Ar + $O_2$ | Ar (5 sccm) | 158 | 1.85 | 419 |
| 70 | Light (Deuterium lamp) | Substrate | 250~400 nm (80 W) | Ar + $O_2$ | — | 173 | 2.05 | 380 |
| 71 | Light (Deuterium lamp) | Atmosphere | 250~400 nm (80 W) | Ar + $O_2$ | — | 161 | 1.87 | 408 |

EXPERIMENTAL EXAMPLE 7

In the present experimental example, lithium secondary batteries were fabricated, each of which had the structure shown in FIG. 3 and comprised a first electrode active material layer 52 made of c-$V_2O_5$, a solid electrolyte layer 53 made of $Li_2S$—$SiS_2$—$Li_3PO_4$, a second electrode active material layer 54 made of $Li_{3-\alpha}CO_\alpha N$ and a second current collector 55 made of Cu. These layers were successively formed on a first current collector 51 made of copper foil by the use of electron-beam vapor-deposition and sputtering.

First, on a first current collector 51 made of copper foil with a thickness of 15 μm, electron-beam vapor-deposition was performed using vanadium as a source, to form a first electrode active material layer 52 made of c-$V_2O_5$ with a thickness of 4 μm. Hereupon, an $1\times10^{-4}$ Torr atmosphere of a mixed gas of Ar and $O_2$ (mixing ratio 1:1) was used, an accelerating voltage and a current of the electron beam to vanadium were 10 kV and 1 A, respectively, and a film was formed while irradiating electrons with the use of the electron source 21 for irradiating a substrate. Conditions of the electron source 21 for irradiating a substrate were that an electron accelerating voltage was 40 V, an electron current was 2 A and a flow rate of Ar out of the gas inlet pipe 23 was 5 sccm.

Next, on the first electrode active material layer 52, high frequency magnetron sputtering was performed using $Li_2S$—$SiS_2$—$Li_3PO_4$ as a target, to form a solid electrolyte layer 53 made of $Li_2S$—$SiS_2$—$Li_3PO_4$ with a thickness of 2 μm. Hereupon, a $1\times10^{-2}$ Torr atmosphere of Ar gas was used, and a target size was 100 mmφ and a high frequency output was 100 W.

Furthermore, on the solid electrolyte layer 53, multi-source electron-beam vapor-deposition was performed using $Li_3N$ and Co as sources, to form a second electrode active material layer 54 made of $Li_{3-\alpha}CO_\alpha N$ with a thickness of 1.4 μm. In this formation, a stainless steel-made mask (thickness 20 μm) having a 1 cm-square quadrate aperture therein was disposed tightly on the solid electrolyte layer 53 to form a second electrode active material layer 54 made of $Li_{3-\alpha}CO_\alpha N$ in the shape of a 1 cm-square rectangular. It was preferable here that α satisfied $0.2 \leq \alpha \leq 0.6$, and a particularly preferable α was 0.4. Hereupon, a $1\times10^{-4}$ Torr atmosphere of $N_2$ gas was used, and an accelerating voltage and a current of the electron beam to $Li_3N$ were 10 kV and 0.25 A, respectively; an accelerating voltage and a current of the electron beam to Co were 10 kV and 1 A, respectively.

Subsequently, on the second electrode active material layer 54 in the shape of a 1 cm-square rectangular formed in the aforesaid manner, electron-beam vapor-deposition was performed using Cu as a source, to form a second current collector 55 made of Cu with a thickness of 3 μm. At this time, a stainless steel-made mask (thickness 20 μm) having a 1 cm-square quadrate opening therein was disposed tightly on the solid electrolyte layer 53, and the second current collector 55 made of Cu was formed in the shape of a 1 cm-square rectangular in a state that the second current collector 55 was laminated on the second electrode active material layer 54. Hereupon, a $1\times10^{-4}$ Torr atmosphere of Ar gas was used, and an accelerating voltage and a current of the electron beam were 10 kV and 1 A, respectively. By this means, lithium secondary batteries were fabricated.

[Evaluation]

The conditions for forming the second electrode active material layer 54 and the evaluation results were shown in Table 5. As revealed from Table 5, during performance of the experiment numbers 50, 52, and 54, the surface temperature measured with the radiation thermometer 6 exceeded 350° C. Further, in the experiment numbers 44 to 50, 52, and 54, the half widths at half maximum of diffraction signal of [111] of $LiMn_2O_4$ were not wider that 0.2°. In the experiment numbers 51, 53, and 55 to 57, on the other hand, broad signals were merely observed.

Further, at an ambient temperature of 20° C., the obtained lithium secondary battery was charged up to 3.2 V at 0.2 C rate (the current value capable of charging the theoretical capacity of the battery in five hours) and then discharged down to 1.5 V at 2 c rate (the current value capable of discharging the theoretical capacity of the battery in half an hour). The discharge capacity per weight of the second electrode active material at the fifth cycle was shown in Table 7.

The x-ray diffraction pattern indicates that, among the experiment numbers expected to have obtained a second electrode active material layer 54 relatively excellent in crystallinity, the capacities of the experiment numbers 44 to 49 were almost identical and thus favorable, whereas those of the experiment numbers 50, 52 and 54 decreased. The decrease in capacity was considered as being resulted from the fact that the irradiation with electrons with an accelerating voltage of 200 V raised the temperature of the second electrode active material layer 54, which induced crystallization of the second electrode active material layer 54 to cause a decrease in ionic conductivity. In the experiment numbers 51, 53 and 55 to 57, the capacities decreased to a large degree, which, presumably, was because the crystallinity of the second electrode active material layer 54 made of $LiMn_2O_4$ was low.

TABLE 7

| | Condition for forming second electrode active material layer 54 | | | | Evaluation result | | |
|---|---|---|---|---|---|---|---|
| | Irradiation source | Object of irradiation | Power | Atmosphere | Gas introduced to irradiation source (flow rate) | Substrate temperature (° C.) | XRD half width at half maximum (deg) | Capacity (mAh/g) |
| 72 | Electron | Substrate | 40 V, 2 A | $N_2$ | $N_2$ (5 sccm) | 268 | 0.17 | 650 |
| 73 | Electron | Atmosphere | 40 V, 2 A | $N_2$ | $N_2$ (5 sccm) | 246 | 0.14 | 660 |
| 74 | Plasma | Substrate | 40 V, 2 A | $N_2$ | $N_2$ (5 sccm) | 257 | 0.12 | 675 |
| 75 | Plasma | Atmosphere | 40 V, 2 A | $N_2$ | $N_2$ (5 sccm) | 248 | 0.15 | 653 |
| 76 | Light (Vacuum spark light source) | Substrate | 15~40 nm (80 W) | $N_2$ | — | 235 | 0.16 | 656 |
| 77 | Light (Vacuum spark light source) | Atmosphere | 15~40 nm (80 W) | $N_2$ | — | 230 | 0.15 | 645 |
| 78 | Electron | Substrate | 200 V, 2 A | $N_2$ | $N_2$ (5 sccm) | 354 | 0.11 | 560 |
| 79 | Electron | Substrate | 10 V, 2 A | $N_2$ | $N_2$ (5 sccm) | 166 | 1.60 | 490 |
| 80 | Electron | Atmosphere | 200 V, 2 A | $N_2$ | $N_2$ (5 sccm) | 359 | 0.10 | 562 |
| 81 | Electron | Atmosphere | 10 V, 2 A | $N_2$ | $N_2$ (5 sccm) | 150 | 1.90 | 457 |
| 82 | Plasma | Substrate | 200 V, 2 A | $N_2$ | $N_2$ (5 sccm) | 356 | 1.02 | 505 |
| 83 | Plasma | Substrate | 10 V, 2 A | $N_2$ | $N_2$ (5 sccm) | 161 | 1.85 | 463 |
| 84 | Light (Deuterium lamp) | Substrate | 250~400 nm (80 W) | $N_2$ | — | 170 | 2.05 | 442 |
| 85 | Light (Deuterium lamp) | Atmosphere | 250~400 nm (80 W) | $N_2$ | — | 164 | 1.87 | 449 |

EXPERIMENTAL EXAMPLE 8

In the present experimental example, a lithium secondary battery constituted by laminating two unit cells was fabricated.

Figure 4:
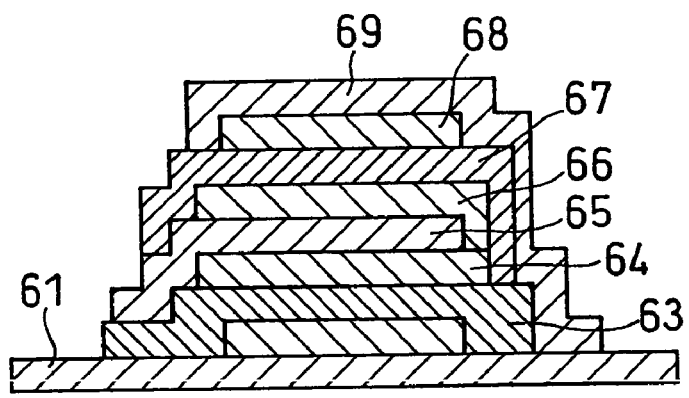
FIG. 4 is a longitudinal sectional view showing the structure of a battery fabricated in the example of the present invention.
Figure 5:
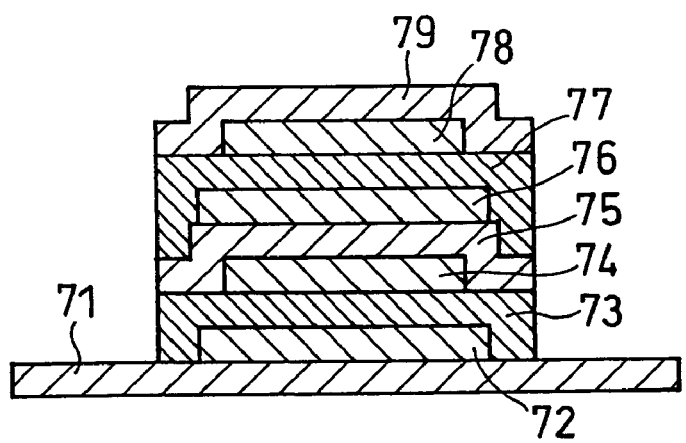
FIG. 5 is a longitudinal sectional view showing the structure of a battery fabricated in the example of the present invention.

The structure of a lithium secondary battery fabricated here was shown in FIG. 4. As shown in FIG. 4, this lithium secondary battery comprises, first, a first current collector 61 made of stainless steel foil, a first electrode active material layer 62 made of $LiCoO_2$, a solid electrolyte layer 63 made of lithium phosphate nitride, a second electrode active material layer 64 made of metallic lithium and a second current collector 65 made of Ni. The lithium secondary battery further comprises a second electrode active material layer 66 made of metallic lithium, a solid electrolyte layer 67 made of lithium phosphate nitride, a first electrode active material layer 68 made of $LiCoO_2$ and a first current collector made of Cu.

These layers were laminated in the order described above by the combined use of electron-beam vapor-deposition, sputtering and dry patterning by means of a metal mask or the like, and a two-stacked-cell battery was then formed using the equipment shown in FIG. 2.

Herein, the apparatus shown in FIG. 2 is almost the same as the apparatus shown in FIG. 1; however, the former additionally comprises a mechanism 13 for controlling a substrate temperature and, in the present experimental example, this mechanism 13 was operated to exert, mainly, a cooling effect so as to keep the backside temperature of the substrate at 140° C. The mechanism 13 has the function of oil-cooling during cooling and the function of heating with an electric heater during heating, and is used in combination with an external controlling device.

First, on a first current collector 61 made of Cu foil with a thickness of 1 μm, electron-beam vapor-deposition was performed to form a first electrode active material layer 62 made of $LiCoO_2$ with a thickness of 1 μm. Sources used here were metal Li and metal Co, which were simultaneously evaporated. In the formation of the first electrode active material layer 62, a stainless steel-made mask (thickness 20 μm) having a 1 cm-square quadrate aperture therein was placed tightly on the first current collector 61 made of Cu foil to form the first electrode active material layer 62 made of $LiCoO_2$ in the shape of a 1 cm-square rectangular. A $1 \times 10^{-4}$ Torr atmosphere of a mixed gas containing 50% of Ar and 50% of oxygen was used, and an accelerating voltage and a current of the electron beam to metal Li were 10 kV and 0.02 A, respectively; an accelerating voltage and a current of the electron beam to metal Co were 10 kV and 0.2 A, respectively. The distance between the source and the substrate was 200 mm and the opening duration time of the shutter for the film formation was 5 minutes.

In parallel with the formation of the first electrode active material layer 62, the conditions shown in Table 8 were set. It should be noted that a flow rate of the mixed gas containing 50% of Ar and 50% of oxygen out of the gas inlet pipe 23 was 50 sccm. Further, the energy irradiation apparatus was not in use in the experiment number 96.

Next, RF magnetron sputtering was performed in an atmosphere of nitrogen, using $Li_3PO_4$ as a target, to form a solid electrolyte layer 63 made of lithium phosphate nitride with a thickness of 2 μm. Hereupon, a $1 \times 10^{-2}$ Torr atmosphere of Ar gas was used, and a target size was 100 mmφ, a high frequency output was 100 W and the time for the film formation was 32 hours. Further, a stainless steel-made mask (thickness 20 μm) having a quadrate aperture therein was disposed as tightly as possible on the first electrode active material layer 62 and the first current collector 61 so that the upper surface of the first electrode active material layer 62 made of $LiCoO_2$ was completely covered with the solid electrolyte layer 63.

Using resistance heating vapor-deposition, a second electrode active material layer 64 made of Li with a thickness of 0.5 μm was formed on the solid electrolyte layer 63. Hereat, a stainless steel-made mask (thickness 20 μm) having a quadrate aperture therein was disposed as tightly as possible on the solid electrolyte layer 63 made of lithium phosphate nitride and the first current collector 61 made of Cu, to form the second electrode active material layer 64 made of Li such that it covered the upper face of the first electrode active material layer 62 while not extending off the upper face of the solid electrolyte layer 63.

Next, a second current collector 65 made of metal Ni with a thickness of 0.5 μm, also serving as an electrode, was formed; a third electrode active material layer 66 made of metal Li with a thickness of 0.5 μm was formed; a solid electrolyte layer 67 made of lithium phosphate nitride with a thickness of 2 μm was formed; and then a forth electrode active material layer 68 made of $LiCoO_2$ with a thickness of 2 μm was formed.

Conditions in the formation of the fourth electrode active material layer 68 were the same as those in the formation of the first electrode active material layer 62. Further, a third current collector 69 made of Cu with a thickness of 3 μm was formed. The third current collector also served as an electrode and were electrically connected to the first current collector 61 having the identical polarity, as shown in FIG. 4. It was necessary, however, that the third current collector 69 would not be brought into contact with the second electrode active material layer 64, the second current collector 65 and the third electrode active material layer 66, which were the counter electrodes. The maximum temperature reached of the substrate during the film formation in each of the process conditions was shown in Table 8.

At ambient temperature 20° C., the obtained lithium secondary battery was charged up to 4.2 V at 2 C rate (the current value capable of charging, in five hours, the theoretical capacity of the battery based on the mass of the first electrode active material layer) and then discharged down to 3.0V at 2 C rate (the current value capable of discharging the theoretical capacity of the battery in half an hour). The discharge capacity per weight of the first electrode active material at the fifth cycle was shown in Table 8.

Table 8 showed the maximum temperature reached of the substrate at the time of forming the forth electrode active material layer 68 and the capacity per weight of the positive electrode active material of the obtained lithium secondary battery. When the maximum temperature reached at the time of forming the fourth electrode active material layer 68 was in the range not higher than 200° C., there were observed decreases in XRD signal and capacity, which were presumably attributed to deficient crystallization. At 375° C., there was observed decrease in capacity, which was presumably caused by heating, and in the temperature range between the above two temperatures, a sufficiently high capacity could be secured.

What should be particularly noted here was that a sufficient capacity was obtained with the irradiation energy up to 300 V while the capacity decreased with the irradiation energy exceeding 300 V.

The decrease in capacity was observed at the accelerating voltage of 200 V in the experiment numbers 1 to 85, whereas the capacities were kept high even at the accelerating voltage of 300 V in the experiment numbers 86 to 94. The reason for this was thought to be that the mechanism 13 exerted the function of controlling a substrate temperature, rendering the surface temperature of the forth electrode active material layer in the formation process higher while also rendering the temperature inside the above layer positioned near the substrate lower, whereby it was possible to suppress the crystallization of the solid electrolyte layer.

It should be noted that 300 V of the accelerating voltage was a value approximating the value obtained by substituting, for the expressions (1) and (2), 5.06 g/cm³ of the density of $LiCoO_2$ and 4 Å of the lattice constant in the [003] plane direction of $LiCoO_2$ (E1=310 eV). It was considered that when the accelerating voltage got closer to or exceeded the upper limit value E1, the irradiation energy directly reached the solid electrolyte layer 67 present in the portion lower than the most outer surface atoms, thereby causing the ionic conductivity of the solid electrolyte layer 67 to decrease.

TABLE 8

| | Condition for forming first electrode active material layer 62 | | Evaluation result | | |
|---|---|---|---|---|---|
| | Electron accelerating voltage (V) | Irradiation current (A) | Substrate temperature (° C.) | XRD half width at half maximum (deg) | Capacity (mAh/g) |
| 86 | 10 | 7 | 153 | — | 58 |
| 87 | 40 | 10 | 170 | 0.25 | 105 |
| 88 | 70 | 20 | 194 | 0.20 | 112 |
| 89 | 100 | 20 | 212 | 0.18 | 120 |
| 90 | 130 | 20 | 235 | 0.16 | 122 |
| 91 | 160 | 20 | 269 | 0.16 | 121 |
| 92 | 200 | 20 | 301 | 0.12 | 123 |
| 93 | 250 | 20 | 335 | 0.10 | 121 |
| 94 | 300 | 20 | 358 | 0.10 | 121 |
| 95 | 350 | 20 | 375 | 0.09 | 89 |
| 96 | — | — | 140 | — | 23 |

EXPERIMENTAL EXAMPLE 9

In the present experimental example, after a Li negative electrode was placed, a crystalline solid electrolyte was formed thereon. A lithium secondary battery was fabricated which had the structure shown in FIG. 3 and comprised a first current collector 51 made of Cu, a first electrode active material layer 52 made of Li, a crystalline solid electrolyte layer 53 made of $c-Li_3PO_4$—$Li_4SiO_4$, a second electrode active material layer 54 made of $c-V_2O_5$ ("c-" indicates crystalline) and a second current collector 55 made of Cu.

These layers were successively laminated with the combined use of electron-beam vapor-deposition and dry patterning by means of a metal mask or the like, along with the use of the apparatus shown in FIG. 2, to fabricate lithium secondary batteries.

On a first current collector 51 made of Cu foil with a thickness of 15 μm, resistance heating vapor-deposition was performed using Li as a source, to form a first electrode active material layer 52 made of Li with a thickness of 0.5 μm. On this first electrode active material layer 52, three-source electron-beam vapor-deposition was performed using $Li_3PO_4$, Li and Si as sources, to form a crystalline solid electrolyte layer 53 made of $Li_3PO_4$—$Li_4SiO_4$. Conditions of the electron beam for vapor-deposition here were that an accelerating voltage was 10 kV, currents were 10 mA (Li), 120 mA (Si) and 80 mA ($Li_3PO_4$), and an atmosphere of a mixed gas of Ar and oxygen (mixing ratio 50:50) was used.

Furthermore, in parallel with the formation of the solid electrolyte layer 53, the mechanism 13 was operated for controlling the substrate temperature and while keeping the backside temperature of the substrate at 100° C., the conditions shown in Table 9 were set. It is to be noted that a flow rate of the mixed gas of Ar and oxygen (mixing ratio 50:50) out of the gas inlet pipe 23 was 50 sccm.

The maximum temperature reached of the substrate surface at the time of forming the solid electrolyte layer 53 was shown in Table 9. In the observation of the formed solid electrolyte 53 by XRD, uncounted numbers of very small peaks were confirmed in the experiment numbers 97 to 99, whereas such peaks were not observed in the experiment number 101.

On the solid electrolyte layer 53, electron-beam vapor-deposition was performed using V as a source, to form a second electrode active material layer 54 made of c-$V_2O_5$ with a thickness of 2 μm. At the time of forming the second electrode active material 54, the electron source 21 for irradiating a substrate was used and the operating conditions thereof were that an electron accelerating voltage was 40 V, an electron current was 2 A, and a flow rate of the mixed gas of Ar and oxygen (50:50) out of the gas inlet pipe 23 was 5 sccm. The distance between the source and the substrate was 600 mm and the opening duration time of the shutter for the film formation was 60 minutes.

On the second electrode active material layer 54 in the shape of a 1 cm-square rectangular formed in the aforesaid manner, electron-beam vapor-deposition was performed using Cu as a source, to form a second current collector 55 made of Cu with a thickness of 3 μm, and a lithium secondary battery having the structure shown in FIG. 3 was thus fabricated. In this formation, a stainless steel-made mask (thickness 20 μm) having a 1 cm-square quadrate aperture therein was placed tightly on the solid electrolyte layer 53, and a second current collector 55 made of Cu was formed in the shape of a 1 cm-square rectangular in such a state as being placed on the second electrode active material layer 54. Hereupon, a $1 \times 10^{-4}$ Torr atmosphere of Ar was used, and an accelerating voltage and a current of the irradiation electron beam were 10 kV and 1 A, respectively.

The charge/discharge characteristic of the obtained lithium secondary battery was measured according to the method described in the aforesaid experimental examples and the results thereof were shown in Table 9. From these results confirmed was a short-circuit phenomenon when the maximum temperature reached of the substrate surface was higher than 170° C. After the discharge, the short-circuited battery was cut off and the cross-section thereof was observed to find that there was a portion where the first electrode active material layer 52 made of Li was nonexistent, and the solid electrolyte layer 53 in the vicinity of the border between the portion without Li and the portion with Li had been cracked. The reason for this was presumably that, as the temperature of the substrate rose at the time of forming the solid electrolyte layer 53, the first electrode active material layer 52 made of Li temporarily melted, causing variation of the thickness thereof, and the shape change thereof due to expansion and shrinkage with the charge/discharge of the battery acted as a distortion which led to cracking of the solid electrolyte layer 53 to form a short-circuit path.

It is to be noted that 250 V of the accelerating voltage of the electron irradiation apparatus in the experiment number 100 where a short circuit occurred was a value higher than the value obtained by substituting, for the expressions (3), 2.5 g/cm³ of the density of the second electrode active material layer 54 and 4 Å of the lattice constant thereof (E3=220 V). It was therefore considered that the battery was short-circuited in the experiment number 100 because: upon arrival of energy directly at the first electrode active material layer 52 made of Li, the first electrode active material layer 52 melted and then coagulated by the surface tension of Li itself, and hence the thickness thereof was not uniformly retained.

TABLE 9

| Condition for forming solid electrolyte layer 53 | | | Evaluation result | |
| --- | --- | --- | --- | --- |
| Electron accelerating voltage (V) | Irradiation current (A) | Substrate temperature (° C.) | XRD signal | Capacity (mAh/g) |
| 97 | 100 | 20 | 209 | Observed | 58 |
| 98 | 150 | 20 | 215 | Observed | 89 |
| 99 | 200 | 20 | 240 | Observed | 86 |
| 100 | 250 | 20 | 278 | Observed | Short circuit |
| 101 | — | — | 140 | None | 15 |

EXPERIMENTAL EXAMPLE 10

In the present experimental example, lithium secondary batteries were fabricated, each of which had the structure shown in FIG. 3 and comprised a first current collector 51 made of Cu foil, a first electrode active material layer 52 made of Li, a solid electrolyte layer 53 made of c-$Li_3PO_4$—$Li_4SiO_4$, a second electrode active material layer 54 made of $LiCoO_2$ and a second current collector 55 made of Cu.

These layers were successively laminated in this order with the combined use of electron-beam vapor-deposition and dry patterning by means of a metal mask or the like, along with the use of the apparatus shown in FIG. 2, to fabricate lithium secondary batteries.

First, on a first current collector 51 made of Cu foil with a thickness of 15 μm, resistance heating vapor-deposition was performed using Li as a source, to form a first electrode active material layer 52 made of Li with a thickness of 0.5 μm. On this layer, three-source electron-beam vapor-deposition was performed using $Li_3PO_4$, Li and Si as sources, to form a solid electrolyte layer 53 made of crystalline $Li_3PO_4$—$Li_4SiO_4$. Conditions of the electron beam for vapor-deposition here were that an accelerating voltage was 10 kV, currents were 10 mA (Li), 120 mA (Si) and 80 mA ($Li_3PO_4$), and an atmosphere of a mixed gas of Ar and oxygen (mixing ratio 50:50) was used.

Furthermore, in parallel with the formation of the solid electrolyte layer 53, the mechanism 13 was operated for controlling the substrate temperature and, with the backside temperature of the substrate kept at 100° C., an electron accelerating voltage and an electron current of the electron source 21 for irradiating a substrate were 100 V and 20 A, respectively, and a flow rate of the mixed gas of Ar and oxygen (mixing ratio 50:50) out of the gas inlet pipe 23 was 50 sccm.

On the solid electrolyte layer 53, two-source electron-beam vapor-deposition was performed using Li and Co as sources, to form a second electrode active material layer 54 made of $LiCoO_2$ with a thickness of 2 μm. A $1 \times 10^{-4}$ Torr atmosphere of a mixed gas containing 50% of Ar and 50% of oxygen (supplied by the gas supply pipe 7) was used, and an accelerating voltage and a current of the elecron beam to Li were 10 kV and 0.1 A, respectively; an accelerating voltage and a current of the electron beam to $Co_3O_4$ were 10 kV and 1 A, respectively. At the time of forming the second electrode active material layer 54, the mechanism 13 for controlling a substrate temperature was operated to keep the backside temperature of the substrate at 100° C., and the conditions shown in Table 10 were used. Further, a flow rate of the mixed gas of Ar and oxygen (mixed ratio 50:50) out of the gas inlet pipe 23 was 50 sccm. It is to be noted that in the experiment number 196, energy was not irradiated. The distance between the source and the substrate was 200 mm and the opening duration time of the shutter for the film formation was 5 minutes.

The maximum temperature reached of the substrate surface in the process of forming the second electrode active material 54 was shown in Table 10. On the second electrode active material layer 54 in the shape of a 1 cm-square rectangular formed in the aforesaid manner, electron-beam vapor-deposition was performed using Cu as a source, to form a second current collector 55 made of Cu with a thickness of 3 µm, and hence a lithium secondary battery having the structure shown FIG. 3 was fabricated. In this formation, a stainless steel-made mask (thickness 20 µm) having a 1 cm-square quadrate aperture therein was placed tightly on the solid electrolyte layer 53, and a second current collector 55 was formed in the shape of a 1 cm-square rectangular in such a state as being laminated on the second electrode active material layer 54. Hereupon, a $1\times10^{-4}$ Torr atmosphere of Ar gas was used, and an accelerating voltage and a current of the irradiation electron beam were 10 kV and 1 A, respectively.

The charge/discharge characteristic of the obtained battery was measured according to the method described in the aforesaid experimental examples and the results thereof were shown in Table 10. According to these results, the lithium secondary batteries of the experiment numbers 102 to 106 exhibited almost the same, high capacities. Presumably, this was because the value defined by the expressions (3) and (4) (E2=15000 eV) was extremely high and thus not easily feasible in terms of equipment.

TABLE 10

| Condition for forming second electrode active material layer 54 | | | Evaluation result | |
|---|---|---|---|---|
| Electron accelerating voltage (V) | Irradiation current (A) | Substrate temperature (° C.) | XRD signal | Capacity (mAh/g) |
| 102 | 200 | 20 | 263 | Observed | 123 |
| 103 | 250 | 20 | 302 | Observed | 126 |
| 104 | 300 | 20 | 322 | Observed | 124 |
| 105 | 350 | 20 | 351 | Observed | 122 |
| 106 | — | — | 100 | None | 5 |

It is to be noted that, although only the electron-beam vapor-deposition was used as the principal means for film formation in the above experimental examples, if such an economic problem as an energy efficiency (generally, 1% or less) is removed, it is technically possible to use with effect a light source in a soft x-ray region such as a vacuum spark.

In the above experimental examples, although $LiCoO_2$, $LiNiO_2$, $LiMn_2O_4$, $Li_{3-\alpha}Co_\alpha N$, $V_2O_5$ or $Li_{1/3}Ti_{5/3})O_4$ was used as the electrode active material, any electrode active material demanding crystallinity can be effectively applied in the present invention. Likewise, although Li was used as the electrode active material having a low melting point, other active materials having the same level of melting point as Li can be effectively acted on.

Moreover, although plasmas, electrons or light (ultraviolet ray) were singly used as the energy source to be irradiated, more than one of these can be simultaneously used. Further, neither a material for a vapor-deposition source nor an ambient gas used in vapor-deposition was limited to the above experimental examples.

Furthermore, although lithium phosphate nitride, $Li_2S$—$SiS_2$—$Li_3PO_4$ or $Li_2O$—$V_2O_5$—$SiO_2$ was used as the solid electrolyte, the present invention was not limited to these. A good conductor which is not responsive directly to Li may be applied to the material for constituting a current collector and, for example, metals such as Cu, Ni and stainless can be used. The other metals are also usable.

INDUSTRIAL APPLICABILIY

According to the present invention, at the time of forming an electrode active material layer, application of energy, having such a size as causing no damage to a substrate, to a surface on which the electrode active material layer is formed, in the form of plasmas, electrons or lights, allows provision of energy for rearrangement to atoms in the vicinity of the most outer surface, thereby making it possible to form an electrode active material layer crystallized without causing a damage to the substrate.

The temperature rise at this time can be sufficiently controlled by adjustment of a cooling power density and suppressed by means of a balance between the cooling power density and an irradiation power density. This enables suppression of a heat damage sustained by the substrate during the process, thereby lowering ionic conductivity of a solid electrolyte layer and suppressing melting of a material with a low melting point such as Li. Further, addition of oxygen or oxygen ions into an atmosphere in contact with a face on which each of various layers is formed renders the obtained layer prevented from oxygen deficiency.

The invention claimed is:

1. A method for preparing an electrochemical device comprising:
   laminating a first current collector, a first electrode active material layer, a solid electrolyte layer, a second electrode active material layer and a second current collector,
   wherein said first electrode active material layer or said second electrode active material layer is formed on a surface of said solid electrolyte layer as a substrate by film formation comprising vapor-depositing atoms, ions or clusters constituting said first electrode active material layer or said second electrode active material layer,
   wherein said film formation further comprises irradiating said atoms, ions or clusters constituting said first electrode active material layer or said second electrode active material layer with energy having a strength E (eV) that satisfies a relational expression:

$$E_a \leq E \leq (70\pm\alpha)\times(\rho_1 d_1)^{1/2} \quad (1)$$

wherein:
   $-7 \leq \alpha \leq 7$, $E_a$ is an activation energy (eV) of said first electrode active material layer or second electrode active material layer,
   $\rho_1$ is a density (g/cm$^3$) of said first electrode active material layer or second electrode active material layer,
   and $d_1$ is a lattice constant (Å) of said first electrode active material layer or second electrode active material layer, and
   wherein said energy is carried only by electrons to be irradiated to a surface of said substrate on which said first electrode active material layer or said second electrode active material layer is to be formed.

2. The method for preparing an electrochemical device in accordance with claim 1, wherein a crystallization temperature for at least one of said first electrode active material layer and said second electrode active material layer is higher than a crystallization temperature of said solid electrolyte layer.

3. The method for preparing an electrochemical device in accordance with claim 1, wherein the strength B (eV) of said energy to be irradiated and a power of the resulting heat exhausted from said substrate are adjusted so that a temperature of said substrate does not exceed the crystallization temperature of said solid electrolyte layer.

4. The method for preparing an electrochemical device in accordance with claim 1, wherein said first electrode active material layer or said second electrode active material layer is formed by film formation comprising vapor-depositing an oxide or nitride constituting said first electrode active material layer or said second electrode active material layer in a gas atmosphere containing oxygen or oxygen ions or in an inert gas atmosphere containing nitrogen or nitrogen ions.

5. The method for preparing an electrochemical device in accordance with claim 1, wherein said first electrode active material layer and said second electrode active material layer are crystalline and said solid electrolyte layer is amorphous.

* * * * *

UNITED STATES PATENT AND TRADEMARK OFFICE
CERTIFICATE OF CORRECTION

| | | |
|---|---|---|
| PATENT NO. | : 7,425,223 B2 | Page 1 of 1 |
| APPLICATION NO. | : 10/432500 | |
| DATED | : September 16, 2008 | |
| INVENTOR(S) | : Hiroshi Higuchi et al. | |

It is certified that error appears in the above-identified patent and that said Letters Patent is hereby corrected as shown below:

Column 32, line 66:

Replace "strength B(eV)" with -- strength E(eV) --.

Signed and Sealed this

Third Day of March, 2009

JOHN DOLL
*Acting Director of the United States Patent and Trademark Office*